(12) United States Patent
Tsukamoto et al.

(10) Patent No.: US 8,416,606 B2
(45) Date of Patent: Apr. 9, 2013

(54) INFORMATION RECORDING AND REPRODUCING DEVICE

(75) Inventors: Takayuki Tsukamoto, Kanagawa-ken (JP); Tsukasa Nakai, Tokyo (JP); Chikayoshi Kamata, Kanagawa-ken (JP); Mariko Hayashi, Chiba-ken (JP); Fumihiko Aiga, Kanagawa-ken (JP); Takeshi Yamaguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 227 days.

(21) Appl. No.: 13/040,823

(22) Filed: Mar. 4, 2011

(65) Prior Publication Data
US 2011/0216582 A1 Sep. 8, 2011

Related U.S. Application Data

(63) Continuation of application No. PCT/JP2008/065940, filed on Sep. 4, 2008.

(51) Int. Cl.
*G11C 11/00* (2006.01)
(52) U.S. Cl. ........ 365/148; 365/100; 365/129; 365/151; 365/163
(58) Field of Classification Search .............. 365/46, 365/94, 100, 113, 129, 148, 151, 163; 257/2–5, 257/296, E31.047, E27.006; 438/29, 95, 438/96, 166, 259, 365, 482, 486, 597
See application file for complete search history.

(56) References Cited

U.S. PATENT DOCUMENTS

| | | | | |
|---|---|---|---|---|
| 6,108,295 A | * | 8/2000 | Ohno et al. | 369/275.2 |
| 6,115,352 A | * | 9/2000 | Ohno et al. | 369/275.4 |
| 7,816,721 B2 | * | 10/2010 | Yamazaki et al. | 257/306 |
| 2007/0133358 A1 | | 6/2007 | Kubo et al. | |
| 2007/0196696 A1 | | 8/2007 | Osano et al. | |
| 2011/0062408 A1 | * | 3/2011 | Kozicki | 257/4 |
| 2011/0315947 A1 | * | 12/2011 | Kozicki | 257/4 |

FOREIGN PATENT DOCUMENTS

| | | |
|---|---|---|
| JP | 2005-200271 | 7/2005 |
| JP | 2007-53125 | 3/2007 |
| JP | 2007-533118 | 11/2007 |
| JP | 2008-84512 | 4/2008 |
| WO | WO 2007/026509 A1 | 3/2007 |

OTHER PUBLICATIONS

Japanese International Search Report issued Nov. 25, 2008 in PCT/JP2008/065940 filed Sep. 4, 2008.
Japanese Written Opinion issued Nov. 25, 2008 in PCT/JP2008/065940 filed Sep. 4, 2008.

* cited by examiner

*Primary Examiner* — Harry W Byrne
(74) *Attorney, Agent, or Firm* — Oblon, Spivak, McClelland, Maier & Neustadt, L.L.P.

(57) ABSTRACT

According to one embodiment, an information recording and reproducing device includes a recording layer and a driving unit. The recording layer includes a first layer containing a first compound. The first compound includes a first positive ion element. The first positive ion element is made of a transition metal element and serves as a first positive ion. The second positive ion element serves as a second positive ion. The driving unit is configured to generate a phase change in the recording layer and to record information by at least one of application of a voltage and application of a current to the recording layer. The coordination number of the first positive ion element at a position of a second coordination of the second positive ion element is 80% or more and less than 100% of the coordination number when the first compound is assumed to be a perfect crystal.

26 Claims, 25 Drawing Sheets

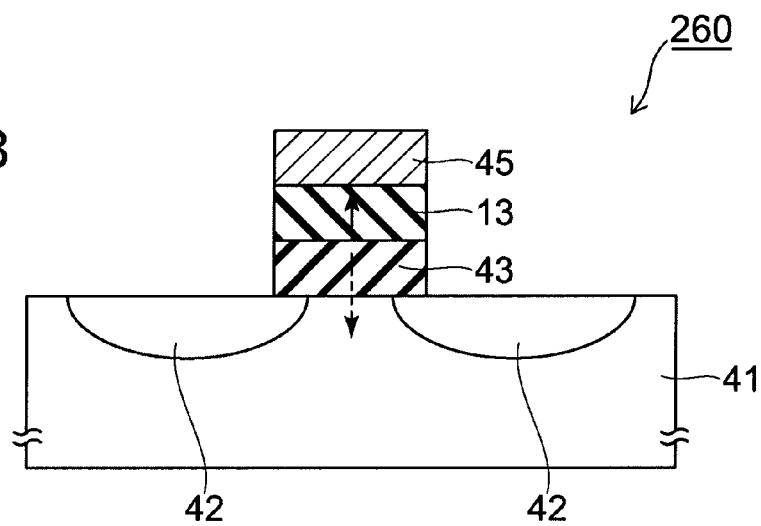
FIG. 23
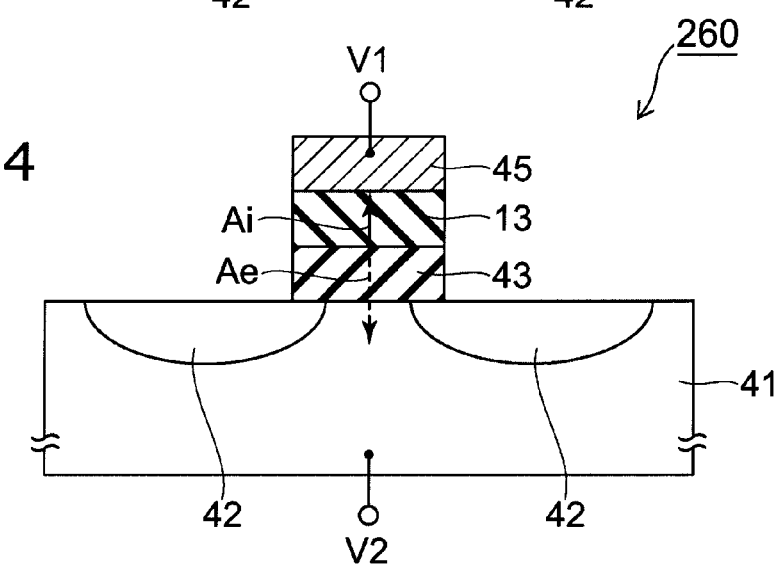
FIG. 24
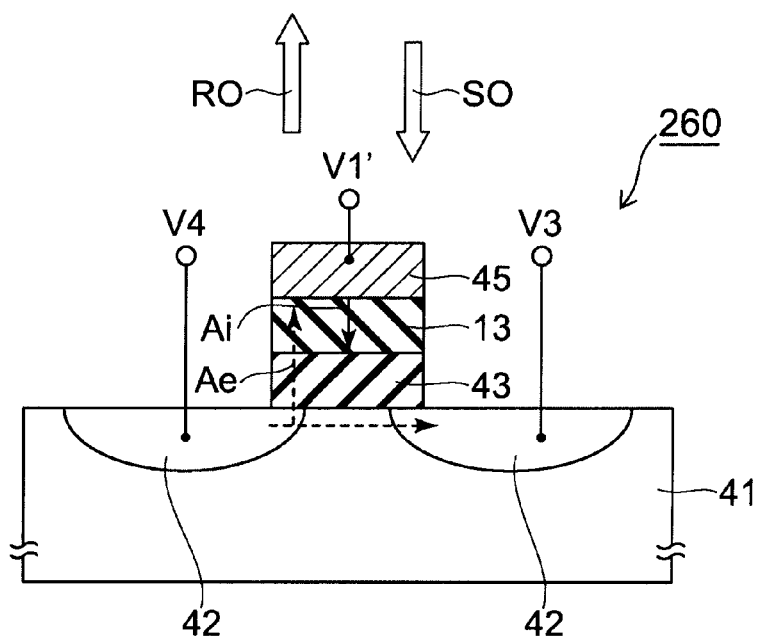

INFORMATION RECORDING AND REPRODUCING DEVICE

CROSS-REFERENCE TO RELATED APPLICATIONS

This is a continuation application of International Application PCT/JP2008/065940, filed on Sep. 4, 2008; the entire contents of which are incorporated herein by reference.

FIELD

Embodiments described herein relate generally to an information recording and reproducing device.

BACKGROUND

Small-sized mobile devices have spread on the worldwide basis and at the same time, with a drastic progress of high-speed information transmission networks, demand for small-sized large-capacity nonvolatile memory has been rapidly expanding. Among others, particularly NAND type flash memory and small-sized HDD (hard disk drive) have achieved rapid progress in recording density and have formed a large market.

Under these circumstances, some ideas on new memory with a purpose of drastically exceeding the limit of recording density are proposed.

Among them, memory using a resistance change material having a low resistance state and a high resistance state is proposed. And a technology in which a recording layer is formed of a composite compound having at least two types of positive ion elements and at least one type of the positive ion element is a transition element having a d orbital incompletely filled with electrons is disclosed (e.g., JP-A 2008-84512(Kokai)).

In this technology, a state of vacancy of a metal element contained in the recording layer is not considered, and there is a room for improvement in terms of stability of an operation.

BRIEF DESCRIPTION OF THE DRAWINGS

FIG. 23 is a schematic sectional view illustrating the configuration of a part of an information recording and reproducing device according to a sixth embodiment;

FIG. 24 is a schematic sectional view illustrating the operation of the information recording and reproducing device according to the sixth embodiment;

DETAILED DESCRIPTION

Figure 1:
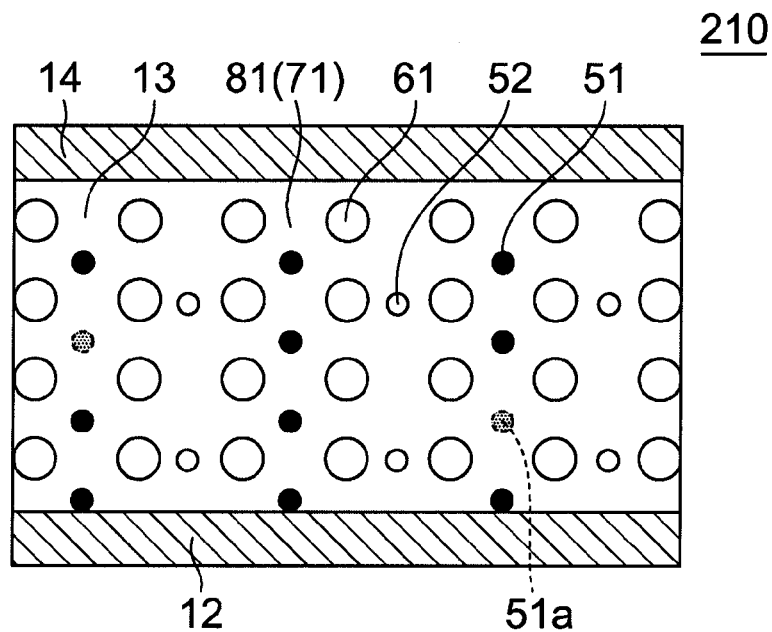
FIG. 1 is a schematic sectional view illustrating the configuration of a part of an information recording and reproducing device according to a first embodiment.

In general, according to one embodiment, an information recording and reproducing device includes a recording layer and a driving unit. The recording layer includes a first layer containing a first compound. The first compound includes a first positive ion element. The first positive ion element is made of a transition metal element and serves as a first positive ion having a d orbital incompletely filled with electrons. The second positive ion element serves as a second positive ion with a lower valence than a valence of the first positive ion. The driving unit is configured to generate a phase change in the recording layer and to record information by at least one of application of a voltage to the recording layer and application of a current to the recording layer. The coordination number of the first positive ion element at a position of a second coordination of the second positive ion element is 80% or more and less than 100% of the coordination number when the first compound is assumed to be a perfect crystal.

Various embodiments will be described hereinafter in detail with reference to the accompanying drawings.

Diagrams are schematic or conceptual and a relationship between a thickness and a width of each portion, a ratio in size of portions and the like are not necessarily the same as actual ones. Also, even if the same portions are indicated, dimensions and ratios might be expressed differently depending on the drawings.

In the description and each figure, the same elements as those already described in relation with the described figures are marked with the same reference numerals, and detailed description will be omitted as appropriate.

First Embodiment

FIG. 1 is a schematic sectional view illustrating the configuration of a part of an information recording and reproducing device according to a first embodiment.

Figure 2:
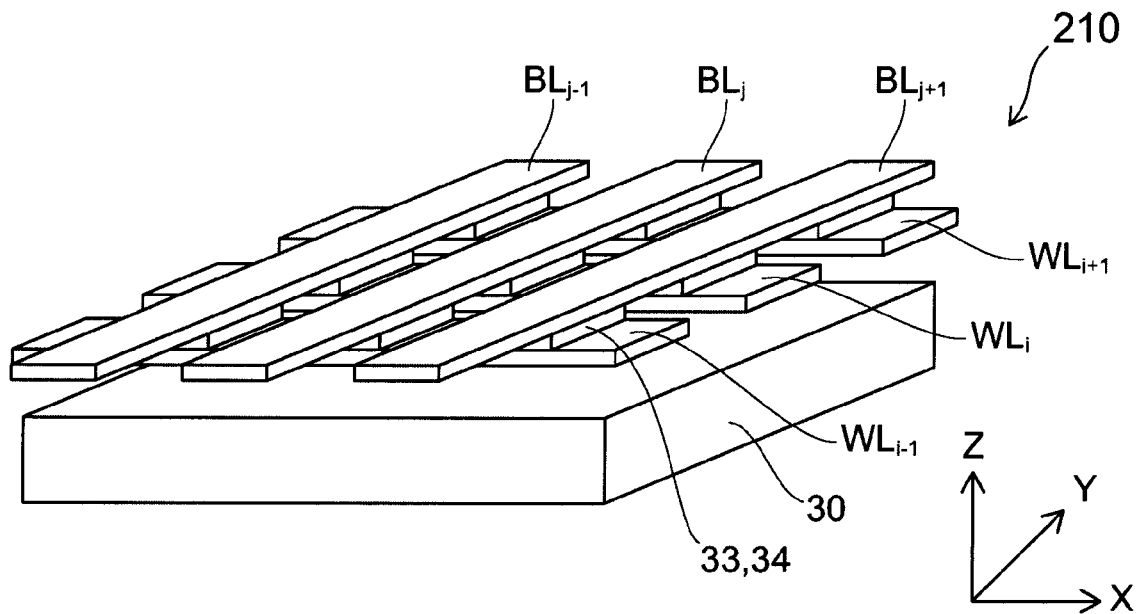
FIG. 2 is a schematic perspective view illustrating the configuration of the information recording and reproducing device according to the first embodiment.

FIG. 2 is a schematic perspective view illustrating the configuration of the information recording and reproducing device according to the first embodiment.

Figure 3:
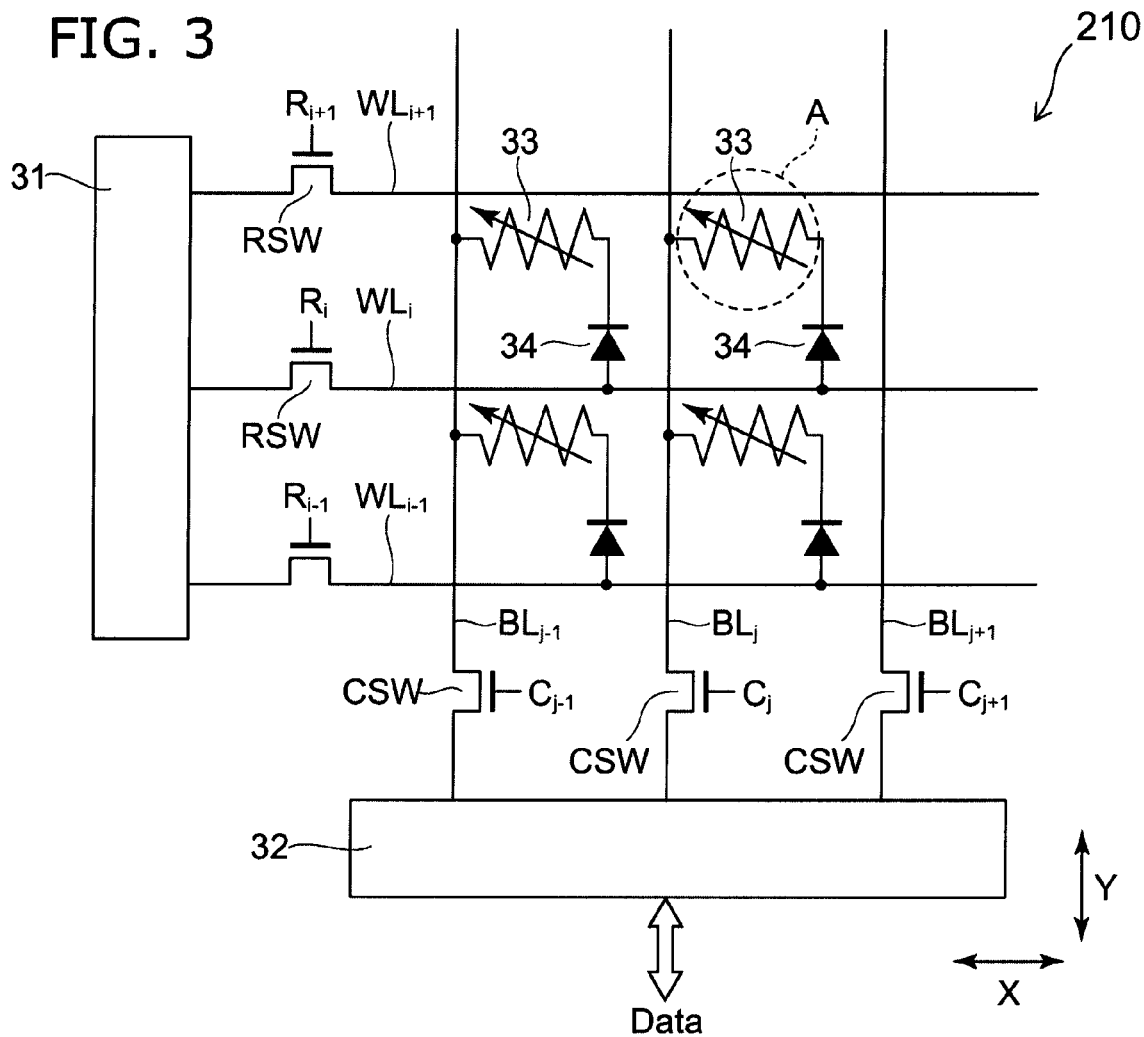
FIG. 3 is a schematic circuit diagram illustrating the configuration of the information recording and reproducing device according to the first embodiment.

FIG. 3 is a schematic circuit diagram illustrating the configuration of the information recording and reproducing device according to the first embodiment.

Figure 4:
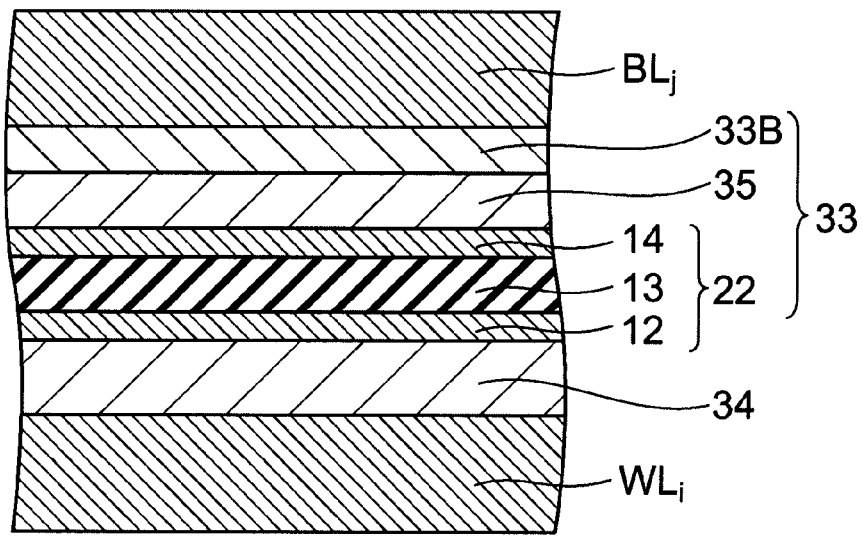
FIG. 4 is a schematic sectional view illustrating the configuration of the part of the information recording and reproducing device according to the first embodiment.

FIG. 4 is a schematic sectional view illustrating the configuration of the part of the information recording and reproducing device according to the first embodiment.

Figure 5:
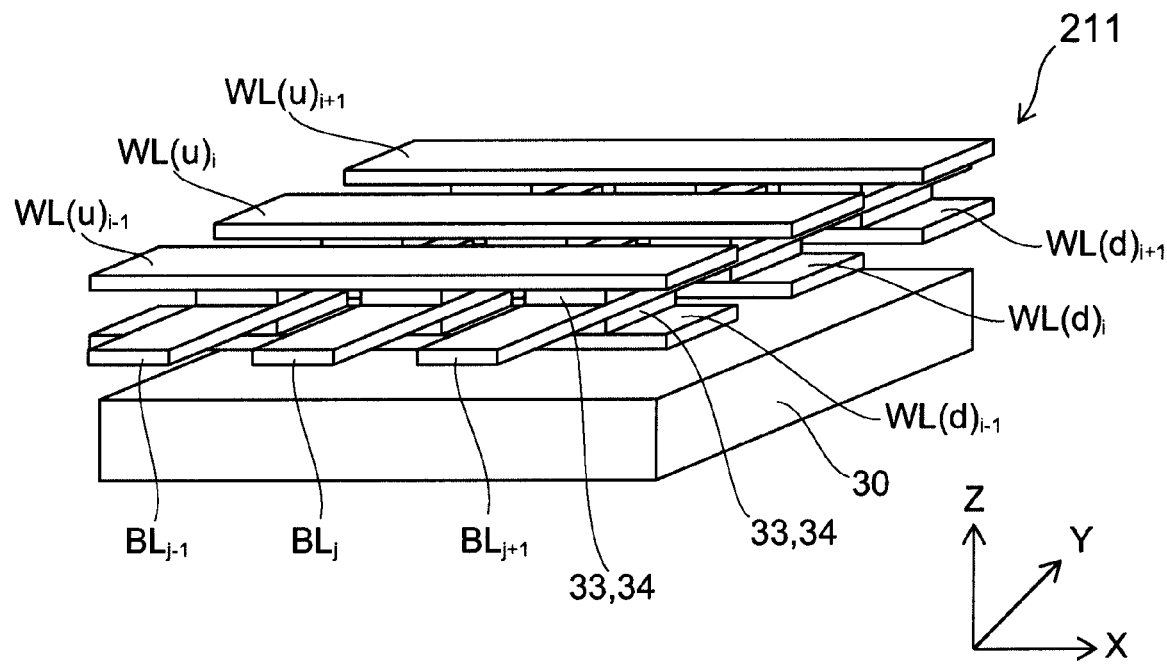
FIG. 5 is a schematic perspective view illustrating the configuration of still another information recording and reproducing device according to the first embodiment.

FIG. 5 is a schematic perspective view illustrating the configuration of another information recording and reproducing device according to the first embodiment.

Figure 6:
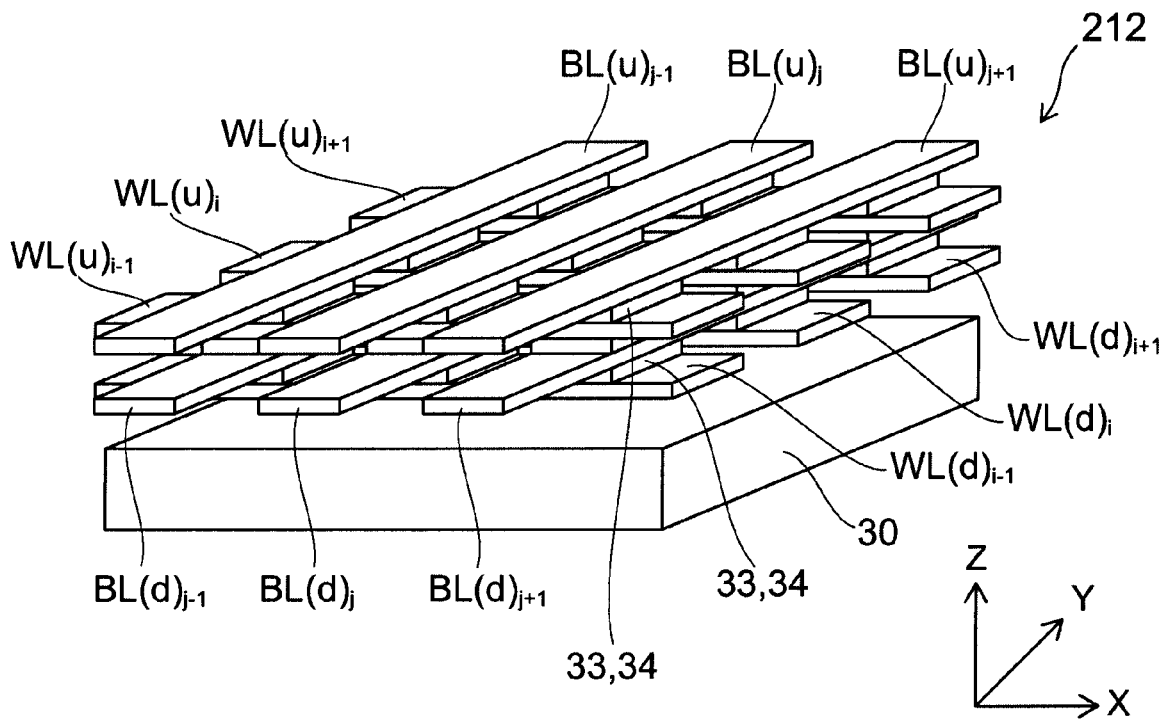
FIG. 6 is a schematic perspective view illustrating the configuration of another information recording and reproducing device according to the first embodiment.

FIG. 6 is a schematic perspective view illustrating the configuration of still another information recording and reproducing device according to the first embodiment.

As illustrated in FIG. 1, an information recording and reproducing device 210 according to the first embodiment has a recording layer 13. And as will be described later, the information recording and reproducing device also has a driving unit that generates a phase change in the recording layer 13 by at least one of application of a voltage to the recording layer 13 and application of a current to the recording layer 13 and records information.

The recording layer 13 presents a phase change between a phase of a high resistance state and a phase of a low resistance state by at least one of the voltage applied and the current applied by the driving unit.

The information recording and reproducing device 210 may be a cross-point type information recording and reproducing device, a probe-memory type information recording and reproducing device, a flash memory type information recording and reproducing device and the like, for example.

First, the information recording and reproducing device 210 of the cross-point type will be described as an example.

As illustrated in FIG. 2 and FIG. 3, in the information recording and reproducing device 210 according to the embodiment, a band-shaped first interconnect (word line $WL_{i-1}$, $WL_i$, $WL_{i+1}$) extending in an X-axis direction is provided on the major surface of a substrate 30. And a band-shaped second interconnect (bit line $BL_{j-1}$, $BL_j$, $BL_{j+1}$) extending in a Y-axis direction orthogonal to the X-axis in the plane parallel with the substrate 30 is provided opposite to the first interconnect (word line $WL_{i-1}$, $WL_i$, $WL_{i+1}$).

In the above example, the first interconnect and the second interconnect are orthogonal to each other, but the first interconnect and the second interconnect may cross each other (non-parallel) in three-dimensional way.

As described above, the plane parallel with the major surface of the substrate 30 is referred to as an X-Y plane, the direction in which the first interconnect extends as the X-axis, an axis orthogonal to the X-axis in the X-Y plane as the Y-axis, and a direction perpendicular to the X-axis and the Y-axis as a Z-axis.

In the above, a suffix i and a suffix j are arbitrary. That is, in FIG. 2 and FIG. 3, the case in which the first interconnects and the second interconnects are provided in three each is shown as an example, but not limited to that, the numbers of the first interconnects and the second interconnects are arbitrary. And in the specific example, the first interconnect becomes a word line and a second interconnect becomes a bit line. However, the first interconnect may be a bit line and a second interconnect may be a word line. In the following, description will be made assuming that the first interconnect is a word line and the second interconnect is a bit.

And as illustrated in FIG. 2 and FIG. 3, a memory cell 33 is sandwiched between the first interconnect and the second interconnect. That is, in the information recording and reproducing device 210, the memory cell 33 is provided at the intersection formed between the bit interconnect and the word interconnect crossing each other in a three-dimensional way.

As illustrated in FIG. 3, one ends of the word lines $WL_{i-1}$, $WL_i$, $WL_{i+1}$ are connected to a word line driver 31 having a decoder function via a MOS transistor RSW as a selection switch, while one ends of the bit lines $BL_{j-1}$, $BL_j$, $BL_{j+1}$ are connected to a bit line driver 32 having decoder and reading functions via a MOS transistor CSW as a selection switch.

Into a gate of the MOS transistor RSW, selection signals $R_{i-1}$, $R_i$, $R_{i+1}$ for selecting a single word line (row) is inputted, while into the gate of the MOS transistor CSW, selection signals $C_{i-1}$, $C_i$, $C_{i+1}$ for selecting a single bit line (column) are inputted.

The memory cell 33 is arranged at the intersection between the word lines $WL_{i-1}$, $WL_i$, $WL_{i+1}$ and bit lines $BL_{j-1}$, $BL_j$, $BL_{j+1}$. It is a so-called cross-point type cell array structure.

To the memory cell 33, a rectifying device 34 that prevents a sneak current in recording/reproducing can be added.

The characteristics of this type of cross-point type cell array structure are that there is no need to connect the MOS transistor individually to the memory cell 33, which is advantageous in large-scale integration.

As illustrated in FIG. 4, between the word line $WL_i$ and the bit line $BL_j$, the memory cell 33 and the rectifying device 34 are provided. The relationship of vertical arrangement of the word line $WL_i$ and the bit line $BL_j$ is arbitrary. The relationship of arrangement with the memory cell 33 and the rectifying device 34 between the word line $WL_i$ and the bit line $BL_j$ is also arbitrary. That is, in the specific example illustrated in FIG. 4, although the memory cell 33 is arranged on the side of the bit line $BL_j$ far from the rectifying device 34, but the memory cell 33 may be arranged on the side of the word line $WL_i$ far from the rectifying device 34.

And as illustrated in FIG. 4, the memory cell 33 has a recording portion 22. The recording portion 22 has a lower electrode 12, an upper electrode 14, and a recording layer 13 provided between the lower electrode 12 and the upper electrode 14.

Also, the memory cell 33 may have a protective layer 33B and a heater layer 35 provided between the recording portion 22 and the protective layer 33B in addition to the recording portion 22. In the specific example, the protective layer 33B is provided on the side of the bit line $BL_j$ of the recording portion 22, but the protective layer 33B may be provided on the side of the word line $WL_i$ of the recording portion 22 or may be provided between the rectifying device 34 and the word line $WL_i$. Moreover, the heater layer 35 and the protective layer 33B are provided as necessary and can be omitted.

At least one of the lower electrode 12 and the upper electrode 14 of the recording portion 22 may be used also as at least one of the word line $WL_i$, the rectifying device 34, the heater layer 35, the protective layer 33B, and the bit line $BL_j$ provided with the recording portion 22, for example, or may be omitted.

As illustrated in FIG. 5 and FIG. 6, by further laminating a laminated structural body including the word line, the bit line, and the memory cell 33 sandwiched between them in plural, information recording/reproducing devices 211 and 212 in a three-dimensional structure can be also constituted.

In the information recording/reproducing devices 210, 211, and 212 according to the embodiment having the above construction, the word line driver 31 and the bit line driver 32 that configure the driving units perform at least one of application of a voltage to the recording layer 13 and application of a current to the recording layer 13 via the word line $WL_i$ and the bit line $BL_j$. Thereby, a phase change occurs in the recording layer 13 and information is recorded. For example, the driving unit applies a voltage to the recording layer 13 so as to generate a phase change in the recording layer 13 and records the information. Also, the recorded information can be read out.

As illustrated in FIG. 1, in the recording portion 22 of the information recording and reproducing device 210 according to the embodiment, the recording layer 13 is provided. In the recording portion 22 of the specific example, the recording layer 13 is provided between the lower electrode 12 and the upper electrode 14, but as already described above, the lower electrode 12 and the upper electrode 14 can be omitted. In the following, for simplification, the description will be made assuming that the lower electrode 12 and the upper electrode 14 are provided.

In the specific example, the recording layer 13 is formed of a first layer 81 containing a first compound 71. However, as will be described later, the recording layer 13 may have a lamination structure of the first layer 81 and another layer different from the first layer 81. In the following, the case in which the recording layer 13 is formed of the first layer 81 will be described first.

The first layer 81 that forms the recording layer 13 contains the first compound 71.

The first compound 71 is a composite compound having at least two types of positive ion elements.

And at least one of the positive ion elements is a transition element having a d orbital incompletely filled with electrons.

That is, the recording layer 13 has first positive ions (M ions 51) and second positive ions ("A" ions 52). Among them, the first positive ion (M ion 51) is a transition element having a d orbital incompletely filled with electrons.

This transition element, that is, the element that forms the first positive ion (M ion 51) may be at least one selected from the group consisting of Ti, V, Cr, Mn, Fe, and Co.

On the other hand, the second positive ion (A ion 52) has a lower valence than the first positive ion (M ion 51).

On the other hand, the element that forms the second positive ion (A ion 52) may be a representative element.

Moreover, the element that forms the second positive ion (A ion 52) may be at least one selected from the group consisting of Mg, Ca and Zn.

Also, the first compound 71 has oxygen ions 61 (X ions 61) as negative ions and is a ternary crystal of an oxide having an element of the first positive ion 51, an element of the second positive ion 52, and an oxygen element of the oxygen ion 61.

Inside the recording layer 13, a diffusion path of a diffusion element is present. Such a first compound 71 includes compounds having a spinel structure, an ilmenite structure, and a delafossite structure.

Then, in the first compound 71 of the recording layer 13 in the information recording and reproducing device 210 according to the embodiment, the coordination number of the first positive ion (M ion 51) located at the position of the second coordination of the second positive ion (A ion 52) element is 80% or more and less than 100% of the coordination number when the first compound 71 is assumed to be a perfect crystal.

That is, around the second positive ions (A ions 52), a vacancy of the first positive ions (M ions 51) is relatively small, and as will be described below, there are sufficient first positive ions (M ions 51) to compensate for the vacancy of the second positive ions (A ions 52) generated in the operation.

As a result, recording can be completed without generating an internal electric field over a wide range. And a nonvolatile information recording and reproducing device with high stability of a repeatable operation is provided.

Figure 7:
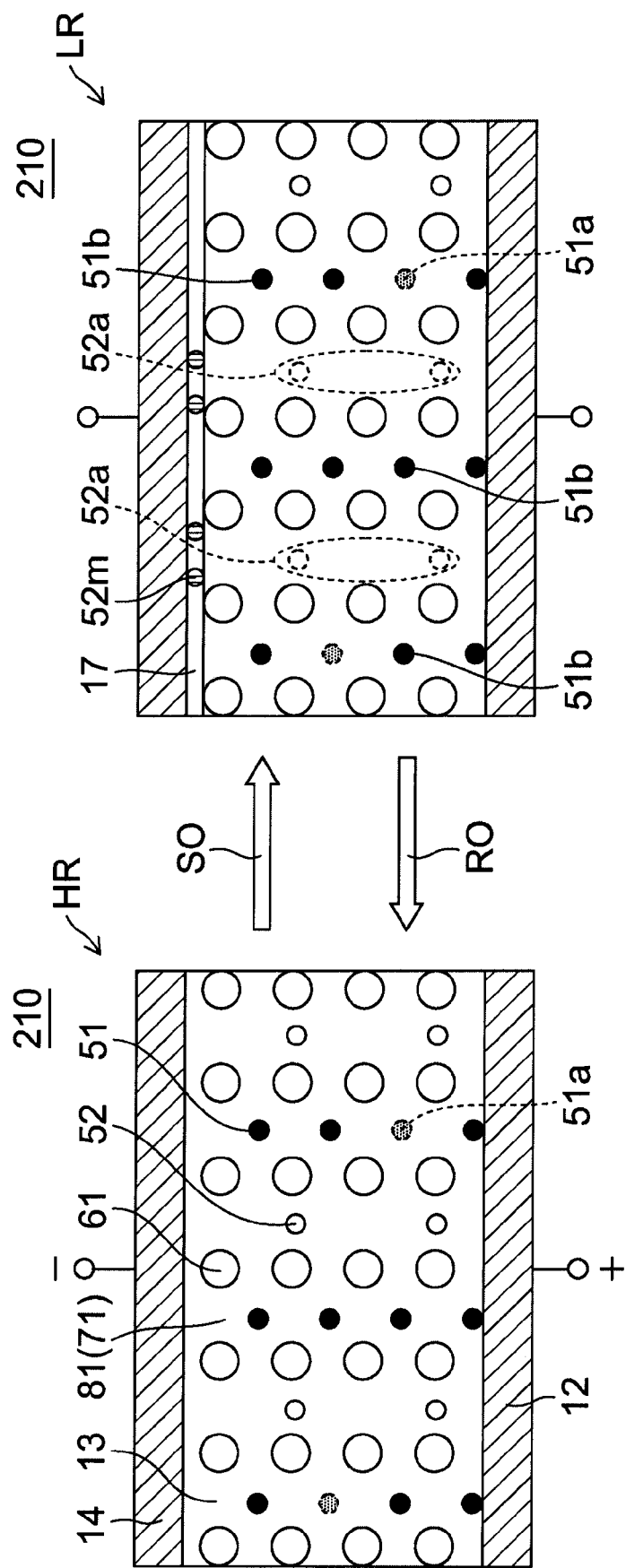
FIG. 7 is a schematic sectional view illustrating the operation of the information recording and reproducing device according to the first embodiment.

FIG. 7 is a schematic sectional view illustrating the operation of the information recording and reproducing device according to the first embodiment.

As illustrated in FIG. 7, the recording layer 13 has a phase in a state with a relatively high resistivity (high resistance state phase HR) and a phase in a state with a relatively low resistivity (low resistance state phase LR).

In the following, an initial state of the recording layer 13 is described as the high resistance state phase HR.

By providing potential gradient in the recording layer 13, the recording layer 13 is phase-changed, and the recording layer 13 is brought into the low resistance state phase LR so as to record information.

First, a state in which a potential of the upper electrode 14 is relatively lower than the potential of the lower electrode 12 is created, for example. The lower electrode 12 is set at a fixed potential (ground potential, for example), and a negative potential is provided to the upper electrode 14, for example.

That is, in the high resistance state phase HR, if a voltage is applied to the recording layer 13 and a potential gradient is produced in the recording layer 13, a part of the A ions 52 moves in the crystal (in the recording layer 13).

And a part of the A ions 52 inside the recording layer 13 moves to the side of the upper electrode (cathode) 14, and the number of positive ions (M ions 51 and A ions 52) inside the recording layer 13, which is a crystal, is relatively decreased with respect to the oxygen ions 61.

The A ions 52 which have moved to the side of the upper electrode 14 receive electrons from the upper electrode 14, precipitate as metal atoms (A atoms 52m), which are metal, and form a metal layer 17.

Therefore, since in a region close to the upper electrode 14, the A ions 52 are reduced and behave as metal, electric resistance is largely lowered.

On the other hand, inside the recording layer 13, the oxygen ions 61 become excessive. As a result, valence of the M ions 51 which is left inside the recording layer 13 is raised. At this time, by selecting the M ions 51 so that the electric resistance is lowered when the valence is raised, in both the metal layer 17 and the inside of the recording layer 13, the electric resistance is lowered by movement of the A ions 52.

That is, by using V, Cr, Mn, Fe, and Co as the element that forms the first positive ion (M ion 51), the electric resistance is lowered when the valence is raised.

On the other hand, by using Ti as the element that forms the first positive ion (M ion 51), for example, the electric resistance is increased when the valence is raised.

As a result, the phase of the entire recording layer 13 is changed to the low resistance state phase LR. That is, an operation of information recording is performed. This is referred to as a set operation SO.

The reproduction of the recorded information is performed by applying a voltage pulse to the recording layer 13 and by detecting a resistance value of the recording layer 13, for example. At this time, the height of the voltage pulse is a low value of such a degree that movement of the A ions 52 is not caused.

The above-described process is a kind of electrolysis, and it can be so considered that an oxidant is generated by electrochemical oxidation on the side of the lower electrode (anode) 12 and a reductant is generated by electrochemical reduction on the side of the upper electrode (cathode) 14.

On the other hand, in an operation to return the low resistance state phase LR to the high resistance state phase HR, that is, in a reset operation RO, for example, a large current pulse is applied to the recording layer 13, the recording layer 13 is heated by Joule heat generated by the application, and an oxidation-reduction reaction of the recording layer 13 is promoted. That is, by the Joule heat caused by the large current pulse, the A ions 52 return into a thermally more stable crystalline structure (inside the recording layer 13), and the initial high resistance state phase HR emerges.

Also, by applying a voltage pulse in the polarity reverse to that in the set operation SO, the reset operation RO can be also performed. That is, similarly to the set operation SO, by setting the lower electrode 12 at a fixed potential and by providing a positive potential to the upper electrode 14, the A atom 52m in the vicinity of the upper electrode 14 provides electrons to the upper electrode 14 and becomes the A ion 52 and then, returns to the inside of the recording layer 13 due to the potential gradient in the recording layer 13. As a result, as for a part of the M ions 51 whose valence has been raised, the valence is decreased to the value, which is the same as the initial one, and the phase is changed to the initial high resistance state phase HR.

As described above, the information recording and reproducing device 210 according to the embodiment performs the recording operation, that is, the set operation SO and the reset operation RO.

In the recording operation as described above, in the recording layer 13 of the information recording and reproducing device 210 according to the embodiment, the coordination number of the first positive ion (M ion 51) element at the position of the second coordination of the second positive ion (A ion 52) element is 80% or more and less than 100% of the coordination number when the first compound 71 is assumed to be a perfect crystal, and around the second positive ions (A ions 52), a vacancy of the first positive ions (M ions 51) is relatively small. As a result, there are sufficient first positive ions (M ions 51) to compensate for the vacancy of the second positive ions (A ions 52) generated in the recording operation.

That is, in the vicinity of the vacant site 52a of the A ion 52 caused by movement of the A ions 52, the M ions 51 can exist. That is, in the vicinity of the vacant site 52a of the A ion 52, the M ions 51b that satisfy a condition of a charge neutral can exist.

That is, if this recording operation is to be performed, when the A ions 52 move, the M ions 51 left in the crystalline structure (inside the recording layer 13) raise the valence. And if the M ions 51 are present in the vicinity of the vacant site 52a of the A ions 52 caused by movement of the A ions 52, the M ions 51 can satisfy the charge neutral condition in the crystalline structure (inside the recording layer 13) by raising the valence, and thus, the change of the crystalline structure caused by the change of the valence is localized. Formation of the internal electric field at this time is also localized.

That is, movement of the atoms with recording (change in entropy) and formation of the internal electric field over a wide range can be kept small, and thus, recording with low power consumption is made possible. Also, since the change caused by recording is localized, when resistance change is repeated, the characteristics can be easily maintained stable.

As a result, a nonvolatile information recording/reproducing device with high stability of a repeatable operation is provided.

In the above, the coordination number of the first positive ion element (M ion 51) at the position of the second coordination of the second positive ion element (A ion 52) can be obtained by XAFS (X-ray Absorption Fine Structure analysis).

If the first compound 71 of the recording layer 13 is in the spinel structure, for example, the second-neighbor element to the A ion 52 becomes the nearest neighbor M ion 51 relating to the A ion 52 and the oxygen ion 61, and thus, an analysis may be made by paying attention to the coordination number of the M ion 51 at the second-neighbor position by the XAFS (X-ray Absorption Fine Structure analysis) or the like.

In order to complete the recording without generation of the internal electric field over the wide range, the coordination number of the positive ion at the position of the second coordination of the second positive ion element (A ion 52) is preferably 80% or more and less than 100% of the case of a perfect crystal.

With the coordination number of 90% and more and less than 100% of the case of a perfect crystal, generation of the internal electric field can be kept to a small range, which is more preferable.

In the case of oxides in general, since it is difficult to obtain a crystal with no vacant site, the coordination number may be approximately 90% or less.

Here, assuming that a probability of existence of an M ion pair at the position of the second coordination of one A ion 52 is p, a desired probability p is examined. For convenience of explanation, it is assumed that the first compound 71 is in the spinel structure and oriented in a direction illustrated in FIG. 1 (that is, a film thickness direction of the first compound 71 and the direction parallel with the Z-axis direction illustrated in FIG. 2). Supposing that the number of A ions 52 aligned in the film thickness direction is x, the probability that the A ions 52 with at least one pair of the M ions 51 at the second coordination in the film thickness direction is provided by $p^x$. Moreover, if y pieces of the A ions 52 are present in the plane parallel with the film thickness direction in the cell (memory cell 33), a probability Q that no M ion pair exists at the position of the second coordination in the film thickness direction in the cell can be expressed as $Q=(1-p^x)^y$.

For example, supposing that the film thickness of the recording layer 13 is 20 nm and the cell size is 25 nm square, x is approximately 40 and y is approximately 2500, and thus, also supposing that p=0.87, it is $Q=7.2 \times 10^{-5}$. Therefore, approximately 72 elements out of $10^6$ elements are estimated to become unstable in operation, and it can be concluded that the device can be subjected to ECC (error correction) efficiently. Therefore, under such condition, it is preferably p=0.87, that is, if the coordination probability of an element at the position of the second coordination is 87% or more, it is satisfactory.

Also, if the film thickness is approximately 10 nm, for example, p=0.77 and $Q=1.4 \times 10^{-6}$ is obtained, and thus, it is satisfactory if p is 77% or more.

Moreover, even if the first compound 71 is in a structure other than the spinel structure, the following extension is possible. Paying attention to the positive ion M 51, a probability that the positive ions A52 are coordinated in a pair at the two opposing second coordination positions is assumed to be p. Moreover, suppose that an average inter-ion distance in the film thickness direction of the positive ions M51 is 1d, an average inter-ion distance in the in-plane direction is 1x, the film thickness is d, and a cell area is S.

If there is a path (stable diffusion path) in which the positive ions M51 having the pair of positive ions A52 present in the form opposing each other at the second coordination position are aligned in the film thickness direction, even if the positive ions M51 in the stable diffusion path move, the valence is changed so that the pair of the positive ions A52 present at the second-neighbor position satisfy the charge neutral condition, and the resistance change is easily generated.

Here, a probability that arrangement of the positive ion M51 at a given position is a stable diffusion path is $p^{d/1d}$. And the probability Q that there is no stable diffusion path in the cell area S is expressed as:

$$Q=(1-p^{d/1d})^{S/1x/1x}$$

Here, when the probability Q is equal to or smaller than a desired value or a requested value of the number in $10^6$ elements with which the operation becomes unstable, a favorable resistance-change operation can be obtained in the entire array.

The cell being not resistance-changed stably and existing with the probability Q can be handled with error correction, cell substitution and the like.

As described above, in the first compound 71, a ratio of the coordination number of the M ions 51 located at the position of the second coordination of the A ion 52 to the coordination number assuming that the first compound 71 is a perfect crystal, that is, the above p is different depending on the crystalline structure and film thickness of the first compound 71 as well as recording capacity and required product specification of the information recording and reproducing device, but considering practical crystalline structure, practical film thickness, practical storage capacity, and product specification, 80% or more is preferable.

In order that the above operation is practically executed, a reset operation is not caused at a room temperature, that is, a sufficiently long retention time is ensured. By setting the valence of the A ion 52 at divalent, a sufficiently long retention time can be ensured. Also, in the case of the delafossite structure, since the coordination number of the A ion 52 is as small as 2, reset is not caused at a room temperature even if the valence of the A ion 52 is 1.

First Comparative Example

Figure 8:
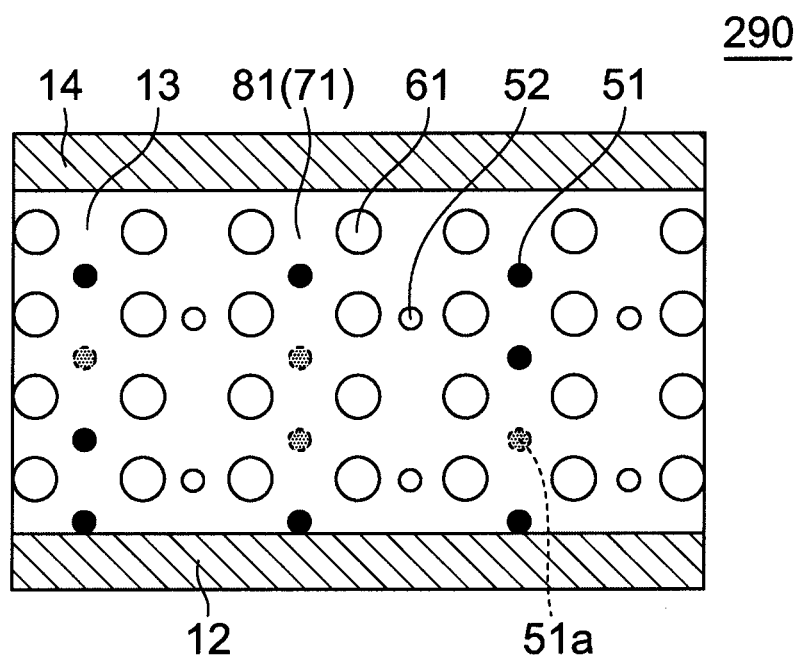
FIG. 8 is a schematic sectional view illustrating the configuration of a part of an information recording and reproducing device of a first comparative example.

FIG. 8 is a schematic sectional view illustrating the configuration of a part of an information recording and reproducing device of a first comparative example.

Figure 9:
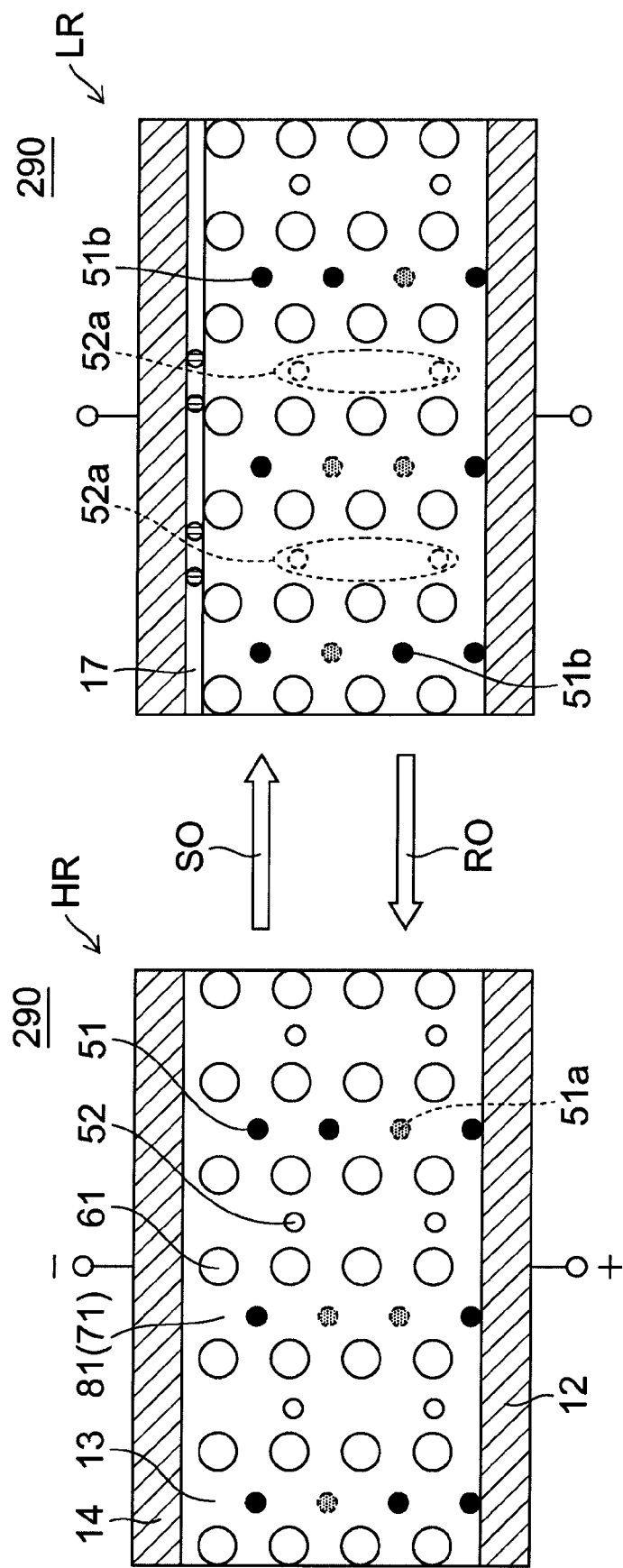
FIG. 9 is a schematic sectional view illustrating the operation of the information recording and reproducing device of the first comparative example.

FIG. 9 is a schematic sectional view illustrating the operation of the information recording and reproducing device of the first comparative example.

As illustrated in FIG. 8, in the information recording and reproducing device 290 of the first comparative example, in the recording layer 13, the coordination number of the positive ion at the position of the second coordination of the second positive ion element is smaller than 80% of the coordination number when the first compound is assumed to be a perfect crystal.

That is, around the second positive ions (A ions 52), a vacancy of the first positive ions (M ions 51) is relatively large.

In this case, too, as illustrated in FIG. 9, by performing the set operation, that is, by applying a voltage to the recording layer 13 in the high resistance state phase HR so as to generate potential gradient in the recording layer 13, a part of the A ions 52 moves in the crystal (in the recording layer 13). Then, the number of M ions 51 existing in the vicinity of the vacant sites 52a of the A ions 52 caused by the movement of the A ions 52 is small. That is, the number of M ions 51b satisfying the condition of charge neutral being to be present in the vicinity of the vacant sites 52a of the A ions 52 is small. Thus, it is difficult to satisfy the charge neutral condition by these M ions 51.

Therefore, since the charge neutral condition is difficult to be satisfied, generation of an internal electric field is increased, which causes unstableness. Also, since the change caused by recording is not localized, when the resistance change is repeated, the resistance in the high resistance state phase HR and the resistance in the low resistance state phase LR are fluctuated.

On the other hand, as already described, in the information recording and reproducing device 210 according to the embodiment, since the first positive ions (M ions 51) can exist in an amount sufficient to make up for the vacancy of the second positive ions (A ions 52) caused in the operation, the charge neutral condition can be stably satisfied, and even if the resistance change is repeated, the characteristics can be easily maintained stable.

As a result, a nonvolatile information recording and reproducing device with high stability of a repeatable operation is provided.

Here, in order to have the above effects exerted, the amount of the vacancies of the M ions 51 in the vicinity of the moving A ions 52 is made small. That is, even if the amount of the M ions 51 in the entire first compound 71 or when the first compound 71 is expressed as $A_xM_yO_z$ (here, x, y, and z are numbers representing molar ratios of the A ion 52, the M ion 51, and the O ion 61 in the first compound, respectively), even if the molar ratio y of the M ion 51 to the molar ratio x of the A ion 52 is sufficiently large, if many vacancies of the M ions 51 locally exist in the vicinity of the A ion 52, the vacancy 52a of the A ion 52 caused by the movement of the A ion 52 cannot be compensated for, which makes the repeatable operation unstable.

On the other hand, in the information recording and reproducing device 210 according to the embodiment, the vacancy of the M ions 51 in the vicinity of the A ions 52, that is, at the second-neighbor position, is small. That is, the coordination number of the M ion 51 at the second-neighbor position of the A ion 52 is 80% or more and less than 100% of the coordination number when the first compound 71 is assumed to be a perfect crystal. As a result, the M ions 51 in the required amount is present in the vicinity of the A ions 52. Thus, as a result, the stability of a repeatable operation can be improved.

As described above, by controlling not the average amount of the M ions 51 in the first compound 71 but the coordination number of the M ions 51 at the second-neighbor position of the A ions 52, a repeatable operation is made stable.

In the following, experiments results relating to the first compound 71 used in the recording layer 13 of the information recording and reproducing device 210 according to the embodiment will be described. In the experiments, $ZnMn_2O_4$ that can be used as the first compound 71 is formed by four types of film making methods, and the XAFS analysis and evaluation of the number of switching times are made for the four types of the films (a film A, a film, B, a film C, and a film D). In $ZnMn_2O_4$, Zn is the second positive ion (A ion 52), and Mn is the first positive ion (M ion 51).

Figure 10:
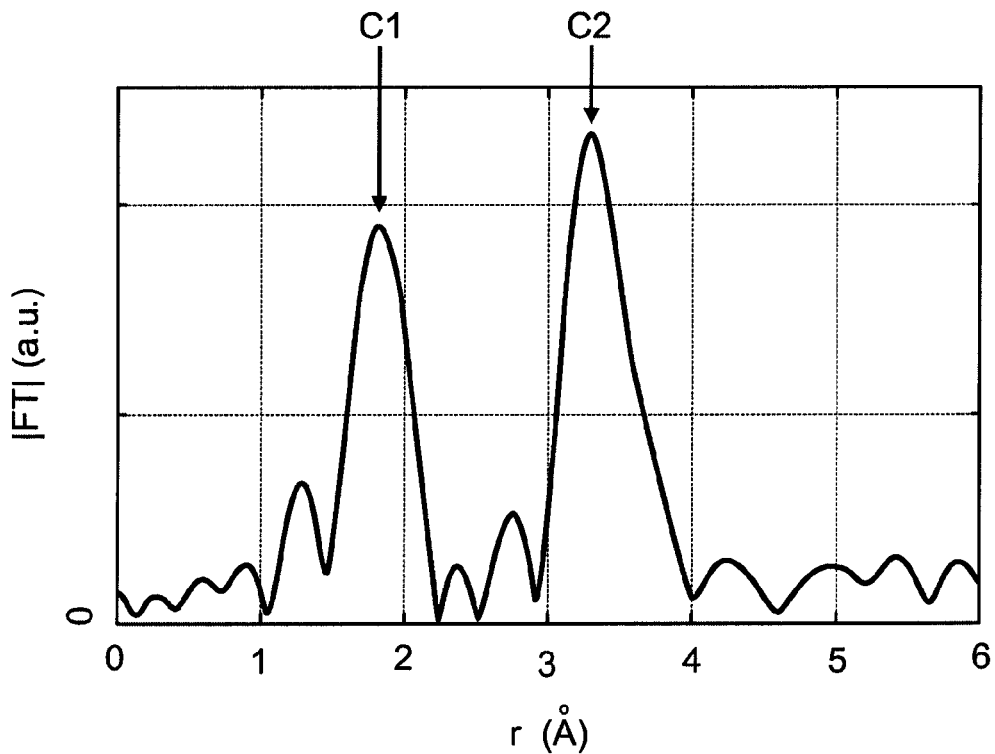
FIG. 10 is a graph illustrating characteristics of the information recording and reproducing device according to the first embodiment.

FIG. 10 is a graph illustrating characteristics of the information recording and reproducing device according to the first embodiment.

That is, this figure is an example of a radial distribution function relating to the Zn ion, which is the A ion 52, in the films A to D, in which the horizontal axis indicates a distance r and the vertical axis indicates intensity FT.

As illustrated in FIG. 10, the intensity of the radial distribution function has peaks at the position of the first coordination (position indicated by an arrow C1) and the position of the second coordination (position indicated by an arrow C2). From this result, assuming that there are an oxygen element and an Mn element in the vicinity of 3.4 angstrom, the radial distribution function is subjected to correction processing, and the coordination number of the Mn element (M ion 51) at the position of the second coordination of the Zn element (A ion 52) is acquired.

On the other hand, the resistance change of the four types of $ZnMn_2O_4$ film, that is, the films A to D, is measured, and the number of switching times of stable resistance change is acquired. The measurement results of the coordination number and the switching times are shown in Table 1.

Here, the device size of the element is 50 μm square, and the film thickness is 50 nm.

TABLE 1

| SAMPLE | CO-ORDINATION NUMBER | RATIO OF COORDINATION NUMBER TO PERFECT CRYSTAL | NUMBER OF SWITCHING TIMES |
|---|---|---|---|
| PERFECT CRYSTAL | 8 | 100% | — |
| FILM A | 4.1 | 51% | 50 |
| FILM B | 6.5 | 81% | ≧3000 |
| FILM C | 6.7 | 84% | ≧3000 |
| FILM D | 7.5 | 94% | ≧3000 |

As illustrated in Table 1, the coordination number of the Mn element at the second coordination position is 4.1 for the film A, 6.5 for the film B, 6.7 for the film C, and 7.5 for the film D. The number of the second-neighbor Mn element of the Zn ion when assuming that the $ZnMn_2O_4$ having the spinel structure is a perfect crystal, that is, the coordination number of the Mn element at the second coordination position is 8. Therefore, the ratio of the coordination number of the Mn element at the second coordination position to the perfect crystal is 51% for the film A, 81% for the film B, 84% for the film C, and 94% for the film D.

On the other hand, the number of switching times of the stable resistance changes is 50 for the film A, while it is 3000 or more for the film B, the film C, and the film D.

As described above, if the ratio of the coordination number of the Mn element, which is the first positive ion (M ion 51), at the second coordination position of the A ion 52 to the coordination number when a perfect crystal is assumed is 51%, the number of switching times is small, while if it is 81%, 84%, and 94%, the number of switching times is large, and favorable characteristics are shown.

As described above, if the coordination number of the Mn element at the second coordination position is approximately 80% or more when a perfect crystal is assumed, a repeatable operation is made stable.

That is, in the information recording and reproducing device 210 according to the embodiment, when the coordination number of the first positive ion (M ion 51) at the second coordination position of the second positive ion (A ion 52) is 80% or more and less than 100% of the coordination number when a perfect crystal is assumed, a stable resistance change can be obtained.

Second Embodiment

Figure 11:
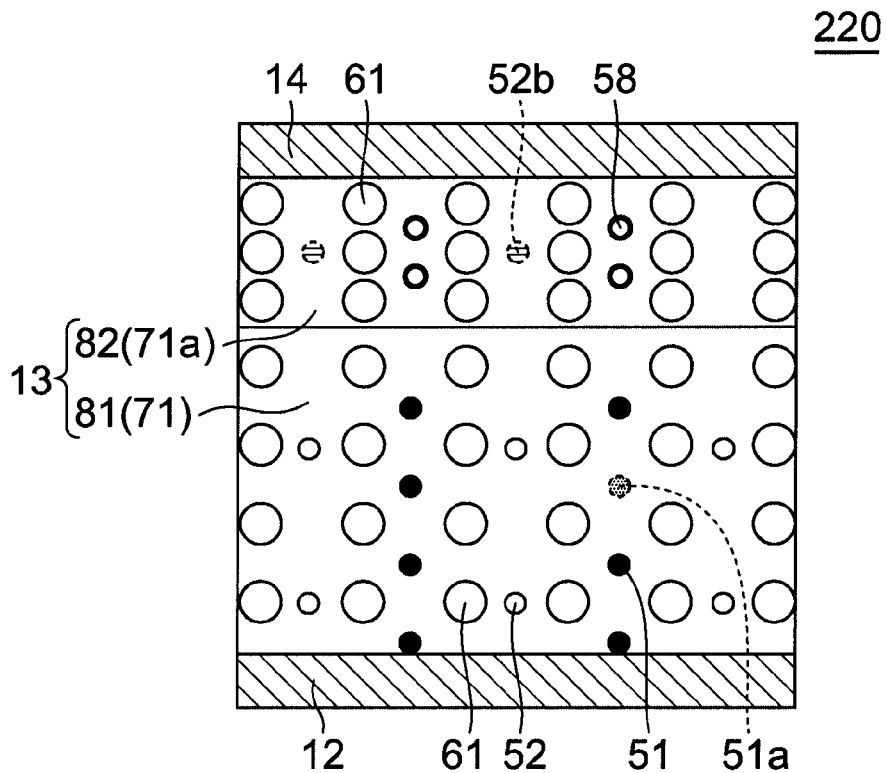
FIG. 11 is a schematic sectional view illustrating the configuration of a part of an information recording and reproducing device according to a second embodiment.

FIG. 11 is a schematic sectional view illustrating the configuration of a part of an information recording and reproducing device according to a second embodiment.

As illustrated in FIG. 11, in another information recording and reproducing device 220 according to the second embodiment, the recording layer 13 further has a second layer 82 provided to contact with the first layer 81. The second layer 82 has a vacant site 52b which can contain the second positive ion (A ion 52). In the specific example illustrated in FIG. 11, the second layer 82 has the oxygen ions 61, transition element ions 58, and the vacant sites 52b.

The other portions can be considered to be similar to the information recording and reproducing device 210 according to the first embodiment, and the description will be omitted.

In the information recording and reproducing device 220 according to the embodiment, by providing the second layer 82 containing a compound 71a that can contain a positive ion element which diffuses from the first layer 81, next to the first layer 81, the diffusing positive ions can be stably contained, which is preferable. As such compounds 71a, the following compounds are preferably used.

The compounds 71a include those expressed by the following chemical formulas when the vacant site 52b in which the A ion 52 is contained is expressed by α. A part of the vacant sites 52b may be occupied by other ions in advance in order to facilitate film formation of the compound 71a.

where M2 is at least one type of an element selected from the group consisting of Ti, Ge, Sn, V, Cr, Mn, Fe, Co, Ni, Nb, Ta, Mo, W, Re, Ru, and Rh.

X2 is at least one type of element selected from the group consisting of O, S, Se, N, Cl, Br and I.

And the molar ratio x is assumed to satisfy $0.3 \leq x \leq 1$.

$$\alpha_x M2 X2_3$$

where M2 is at least one type of an element selected from the group consisting of Ti, Ge, Sn, V, Cr, Mn, Fe, Co, Ni, Nb, Ta, Mo, W, Re, Ru, and Rh.

X2 is at least one type of element selected from the group consisting of O, S, Se, N, Cl, Br and I.

And the molar ratio x is assumed to satisfy $1 \leq x \leq 2$.

$$\alpha_x M2 X2_4$$

where M2 is at least one type of an element selected from the group consisting of Ti, Ge, Sn, V, Cr, Mn, Fe, Co, Ni, Nb, Ta, Mo, W, Re, Ru, and Rh.

X2 is at least one type of element selected from the group consisting of O, S, Se, N, Cl, Br and I.

And the molar ratio x is assumed to satisfy $1 \leq x \leq 2$.

$$\alpha_x M2 PO_z$$

where M2 is at least one type of an element selected from the group consisting of Ti, Ge, Sn, V, Cr, Mn, Fe, Co, Ni, Nb, Ta, Mo, W, Re, Ru, and Rh.

P is a phosphorous element, and O is an oxygen element.

And the molar ratio x and a molar ratio z are assumed to satisfy $0.3 \leq x \leq 3$ and $4 \leq z \leq 6$.

$$\alpha_x M2 O_5$$

where M2 is at least one type of an element selected from the group consisting of V, Cr, Mn, Fe, Co, Ni, Nb, Ta, Mo, W, Re, Ru, and Rh.

O is an oxygen element.

And the molar ratio x is assumed to satisfy $0.3 \leq x \leq 2$.

The compound 71a preferably has a structure including at least one selected from the group consisting of a hollandite structure, a ramsdellite structure, an anatase structure, a brookite structure, a pyrolusite structure, a $ReO_3$ structure, a $MoO_{1.5}PO_4$ structure, a $TiO_{0.5}PO_4$ structure, a $FePO_4$ structure, a $\beta MnO_2$ structure, a $\gamma MnO_2$ structure, a $\lambda MnO_2$ structure, a spinel structure, and an ilmenite structure. Particularly, the compound most preferably has the spinel structure, which is the same structure as the first compound 71.

Also, a Fermi level of the electron in the first layer 81 is set lower than the Fermi level of the electron in the second layer 82. This is one of the preferable conditions to provide reversibility to the state of the recording layer 13. Here, all the Fermi levels are assumed to have values measured from vacuum levels.

By using such combination of materials in the recording layer 13 and by facilitating giving/receiving of ions between the first layer 81 and the second layer 82, power consumption required for the resistance change can be reduced, and thermal stability can be improved.

Figure 12:
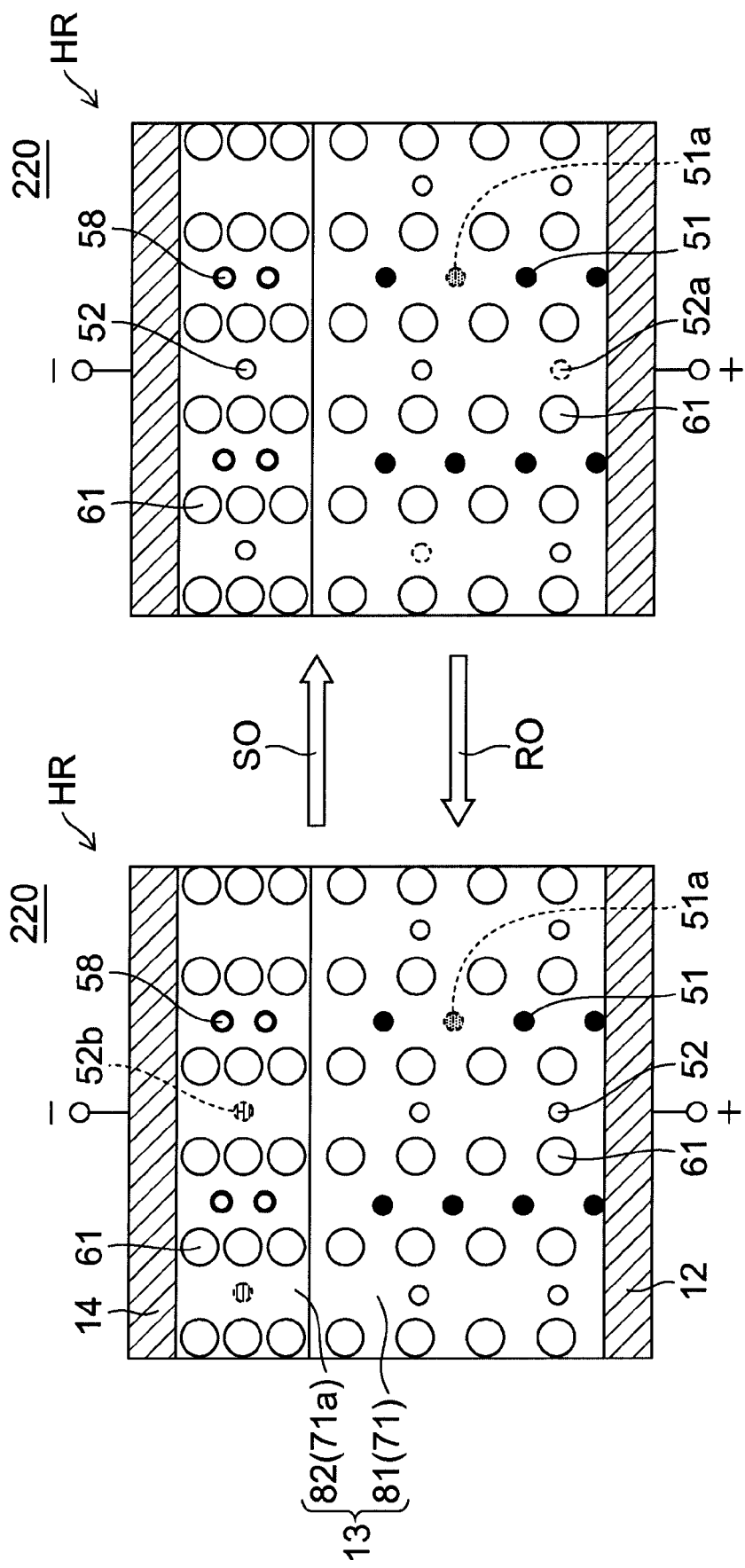
FIG. 12 is a schematic sectional view illustrating the operation of another information recording and reproducing device according to the second embodiment.

FIG. 12 is a schematic sectional view illustrating the operation of another information recording and reproducing device according to the second embodiment.

As illustrated in FIG. 12, in the information recording and reproducing device 220 according to the embodiment, the recording layer 13 has the first layer 81 and the second layer 82, and in the high resistance state phase HR, by applying a voltage to the recording layer 13 so as to generate potential gradient in the recording layer 13, a part of the second positive ions (A ions 52) moves in the crystal (in the first layer 81). Then, the second positive ions (A ions 52) are contained in the vacant sites 52b of the second layer 82 and made stable.

As described above, in the information recording and reproducing device 220 according to the embodiment, the recording layer 13 has the second layer 82, and more stable operation is made possible.

In the information recording and reproducing device according to the embodiment, the recording layer 13 may be formed by laminating pluralities of the first layers 81 and the second layers 82 alternately.

Figure 13:
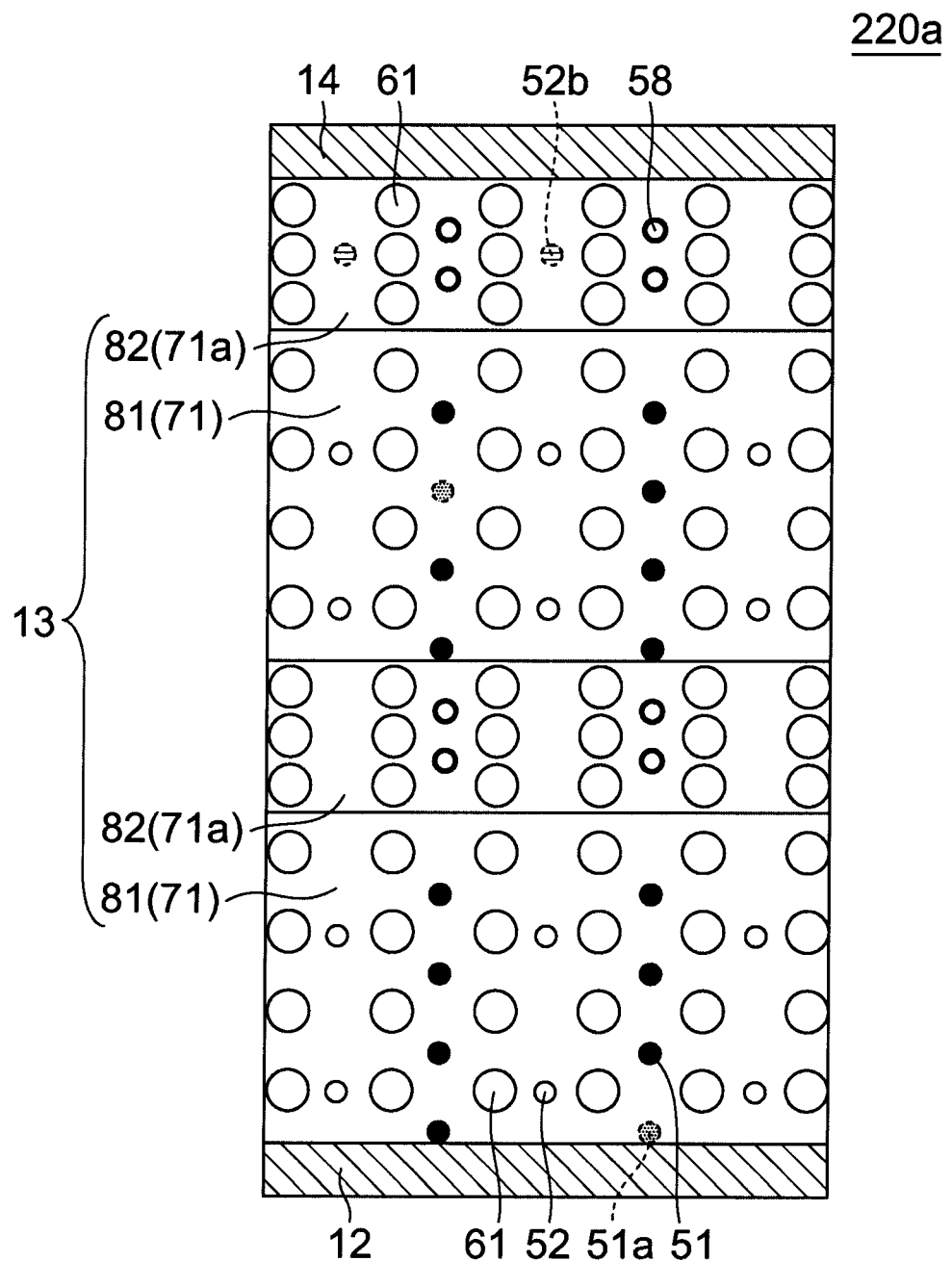
FIG. 13 is a schematic sectional view illustrating the configuration of a part of another information recording and reproducing device according to the second embodiment.

FIG. 13 is a schematic sectional view illustrating the configuration of a part of another information recording and reproducing device according to the second embodiment.

Figure 14:
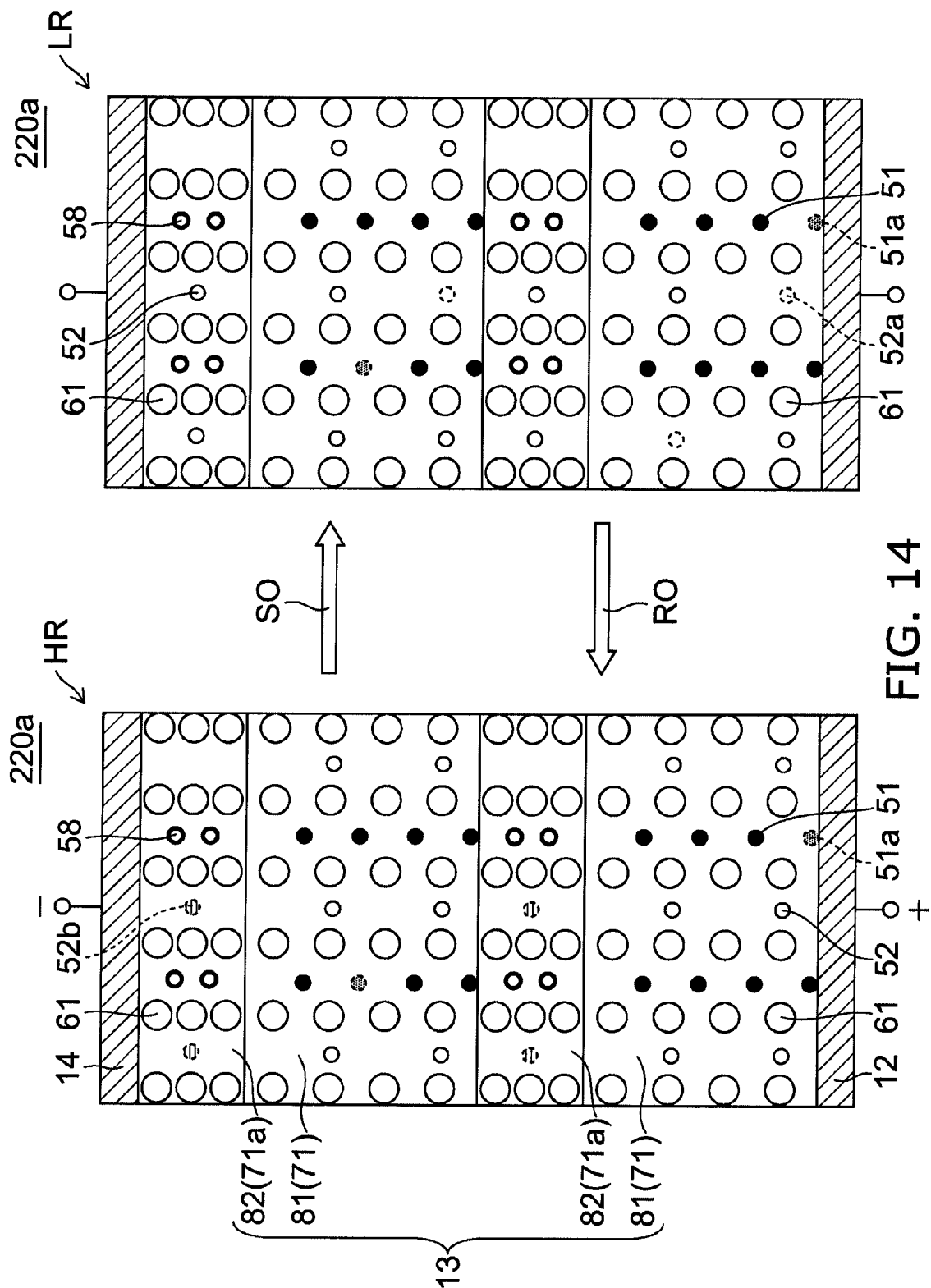
FIG. 14 is a schematic sectional view illustrating the operation of another information recording and reproducing device according to the second embodiment.

FIG. 14 is a schematic sectional view illustrating an operation of another information recording and reproducing device according to the second embodiment.

As illustrated in FIG. 13, in another information recording and reproducing device 220a according to the second embodiment, the recording layer 13 has lamination of two layers of a combination of the first layer 81 and the second layer 82.

Then, as illustrated in FIG. 14, if potential gradient is generated in the recording layer 13, in each of the first layer 81, a part of the second positive ions (A ions 52) moves in the crystal (in the first layer 81), the second positive ions (the A ions 52) are contained in the vacant sited 52b of the second layer 82 next to the first layer 81 and can operate stably.

In the specific example, although the two layers of the combination of the first layer 81 and the second layer 82 are laminated in the recording layer 13, they may be laminated in three layers or more.

Third Embodiment

An information recording and reproducing device 230 according to a third embodiment may be also a cross-point type information recording and reproducing device or may be a probe memory type information recording and reproducing device. Since the configuration other than the recording portion 22 can be made similar to the information recording and reproducing devices according to the first and the second embodiments, only the recording portion 22 will be described below.

Figure 15:
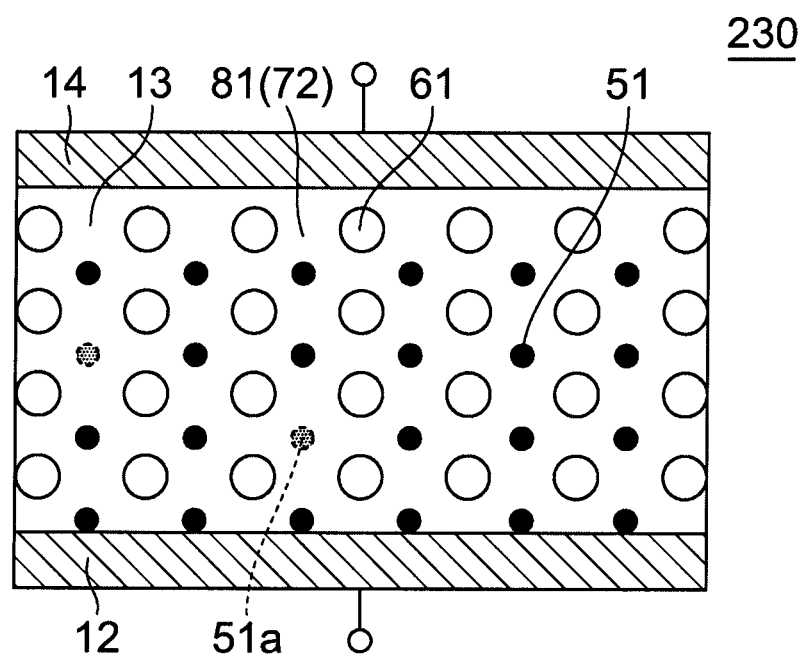
FIG. 15 is a schematic sectional view illustrating the configuration of a part of an information recording and reproducing device according to a third embodiment.

FIG. 15 is a schematic sectional view illustrating the configuration of a part of the information recording and reproducing device according to the third embodiment.

As illustrated in FIG. 15, in the recording portion 22 of the information recording and reproducing device 230 according to the embodiment, the recording layer 13 is provided. In the recording portion 22 of the specific example, the recording layer 13 is provided between the lower electrode 12 and the upper electrode 14, but as already described, the lower electrode 12 and the upper electrode 14 can be omitted. In the following, in order to facilitate the description, the lower electrode 12 and the upper electrode 14 are assumed to be provided.

In the specific example, the recording layer 13 is formed of the first layer 81 containing a second compound 72. However, as will be described later, the recording layer 13 may have a lamination structure of the first layer 81 and a layer different from the first layer 81. In the following, a case in which the recording layer 13 is formed of the first layer 81 will be described first.

The first layer 81 which becomes the recording layer 13 contains the second compound 72.

The second compound 72 includes the first positive ion 51 (M ion 51), which is a transition metal element, and an oxide containing oxygen including the negative ion 61.

Then, the first positive ion 51 is a positive ion of the transition metal element having at least a d orbital incompletely filled with electrons and is a positive ion whose valence is changeable.

An element which becomes the above transition element, that is, the first positive ion 51 (M ion 51) may be at least one type of element selected from Ti, V, Cr, Ni, and Cu.

The first positive ion 51 (M ion 51) may be at least one type of element selected from Hf and W. Hf and W are preferable because they are well compatible with semiconductor process, for example. Ti is also preferable because it is well compatible with semiconductor process, for example.

Also, the second compound 72 has the oxygen ion 61 (X ion 61) as the negative ion and is a binary crystalline body having an element of the first positive ion 51 and an oxygen element of the oxygen ion 61.

In the second compound 72 of the recording layer 13 in the information recording and reproducing device 230 according to the embodiment, the coordination number of the element of another first positive ion 51 at the position of the second coordination of the element of the first positive ion 51 is 80% or more and less than 100% of the coordination number when the second compound 72 is assumed to be a perfect crystal.

That is, around the first positive ions (M ions 51), a vacancy of the first positive ions (M ions 51) is relatively small, and as will be described below, there are sufficient first positive ions (M ions 51) to compensate for the vacancy of the first positive ions (M ions 51) generated in the operation.

As a result, recording can be completed without generating an internal electric field over a wide range. And a nonvolatile information recording and reproducing device with high stability of a repeatable operation is provided.

Figure 16:
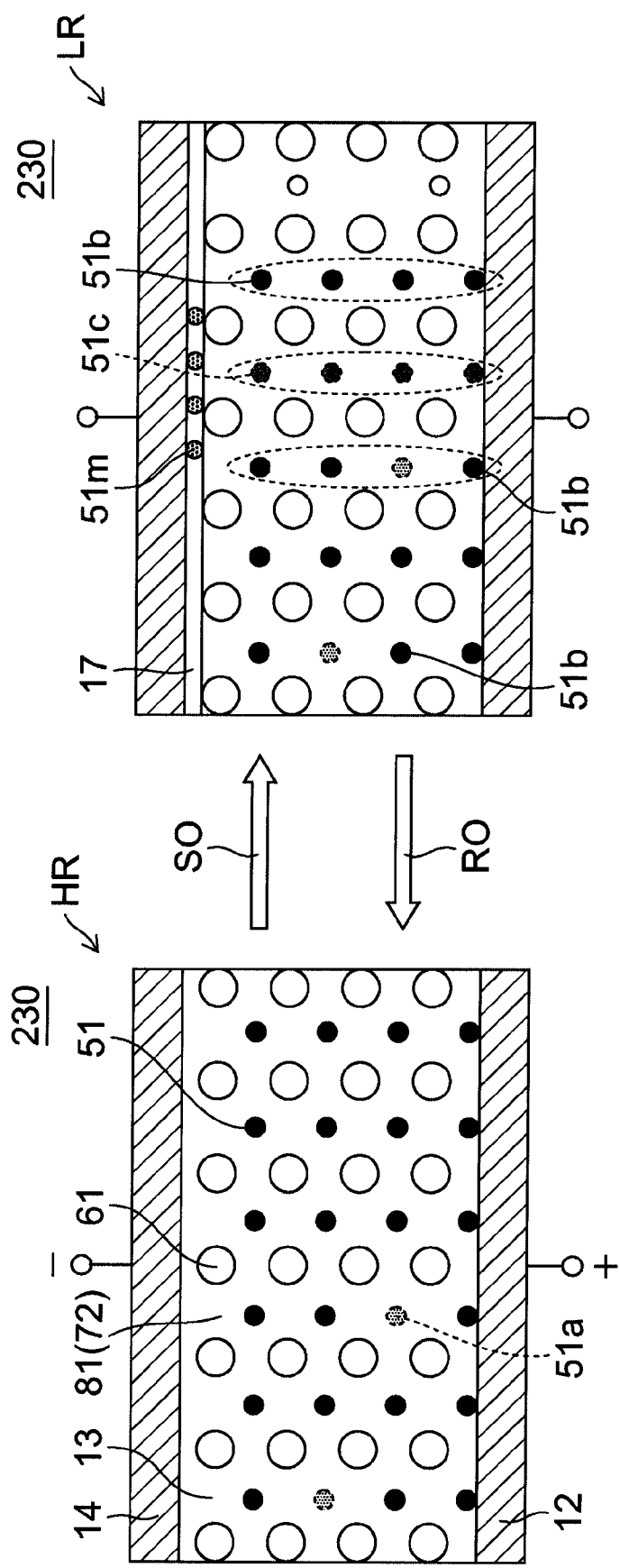
FIG. 16 is a schematic sectional view illustrating the operation of the information recording and reproducing device according to the third embodiment.

FIG. 16 is a schematic sectional view illustrating the operation of the information recording and reproducing device according to the third embodiment.

As illustrated in FIG. 16, in the case of the information recording and reproducing device 230 according to the embodiment, too, the recording layer 13 has a phase in a state with a relatively high resistivity (high resistance state phase HR) and a phase in a state with a relatively low resistivity (low resistance state phase LR).

In the following, an initial state of the recording layer 13 is described as the high resistance state phase HR.

By providing potential gradient in the recording layer 13, the recording layer 13 is phase-changed, and the recording layer 13 is brought into the low resistance state phase LR so as to record information.

For example, as illustrated in FIG. 16, a state in which the potential of the upper electrode 14 is relatively lower than the potential of the lower electrode 12 is created. That is, the lower electrode 12 is set at a fixed potential (ground potential, for example), and a negative potential is given to the upper electrode 14.

At this time, a part of the M ions 51 in the recording layer 13 moves to the side of the upper electrode (cathode) 14, and in the center part in the recording layer (crystal) 13 (a part away from the upper electrode 14), the number of the M ions 51 is relatively decreased as compared with the oxygen ions 61.

The M ions 51 which have moved to the side of the upper electrode 14 receive electrons from the upper electrode 14, precipitate as M atoms 51$m$, which are metal, and form the metal layer 17.

Therefore, in a region close to the upper electrode 14, since the M ions are reduced and behave as metal, their electric resistance is largely decreased.

On the other hand, inside the recording layer 13 (a part away from the upper electrode 14), the oxygen ions 61 become excessive, and as a result, the valence of the M ions 51 left inside the recording layer 13 is raised. At this time, by selecting the M ion 51 so that the electric resistance is lowered when the valence is raised, the electric resistance is decreased by movement of the M ions 51 both in the metal layer 17 and the recording layer 13.

That is, by using V, Cr, Ni, Cu and the like as an element which becomes the first positive ion 51 (M ion 51), the electric resistance is lowered when the valence is raised. On the other hand, by using Ti as an element which becomes the first positive ion 51 (M ion 51), for example, the electric resistance is increased when the valence is raised.

As a result, the entire recording layer 13 is phase-changed to the low resistance state phase. That is, information recording is performed. That is, the set operation SO is performed.

Then, the reproduction of the recorded information is performed by applying a voltage pulse, for example, to the recording layer 13 and detecting a resistance value of the recording layer 13. However, the height of the voltage pulse is set at a low value that would not cause movement of the M ions 51.

The process described above is a kind of electrolysis, and it can be considered that an oxidant is generated by electrochemical oxidation on the side of the lower electrode (anode) 12, while a reductant is generated by electrochemical reduction on the side of the upper electrode (cathode) 14.

On the other hand, in the reset operation RO to return the low resistance state phase LR to the high resistance state phase HR, for example, a large current pulse is applied to the recording layer 13, the recording layer 13 is heated by Joule heat generated by that, and an oxidation-reduction reaction of the recording layer 13 is promoted. That is, by the Joule heat caused by the large current pulse, the A ions 52 return into the crystalline structure (inside the recording layer 13) which is thermally more stable, and the initial high resistance state phase HR emerges.

Also, by applying a voltage pulse in the polarity reverse to that in the set operation SO, the reset operation RO can be also performed. That is, similarly to the set operation SO, setting the lower electrode 12 at a fixed potential and by providing a positive potential to the upper electrode 14, the M atom 51$m$ in the vicinity of the upper electrode 14 provides electrons to the upper electrode 14 and becomes the M ion 51 and then, returns to the inside of the recording layer 13, which is a crystalline structure, due to the potential gradient in the recording layer 13. As a result, as for a part of the M ions 51 with the valence having been raised, the valence is decreased to the same value as the initial one, and the phase is changed to the initial high resistance state phase HR.

As described above, the information recording and reproducing device 230 according to the embodiment performs the recording operation, that is, the set operation SO and the reset operation RO.

In the recording operation as described above, in the recording layer 13 of the information recording and reproducing device 230 according to the embodiment, the coordination number of another first positive ion 51 at the position of the second coordination of the element of the first positive ion 51 is 80% or more and less than 100% of the coordination number when the second compound 72 is assumed to be a perfect crystal, and around the first positive ions (M ions 51), a vacancy of the first positive ions (M ions 51) is relatively small. As a result, there are sufficient first positive ions (M ions 51) to compensate for the vacancy of the first positive ions (M ions 51) generated by the recording operation.

That is, in the vicinity of a vacant site 51c of the M ion 51 caused by movement of the M ions 51, the M ions 51 can exist. That is, in the vicinity of the vacant site 51c of the M ion 51, the M ions 51b that satisfy a condition of a charge neutral can be present.

That is, if this recording operation is to be performed, when the M ions 51 move, the M ions 51 left in the crystalline structure of the center part of the recording layer 13 raise the valence. And if the M ions 51 are present in the vicinity of the vacant site 51a of the M ions 51 caused by movement of the M ions 51, the M ions 51 can satisfy the charge neutral condition in the crystalline structure (inside the recording layer 13) by increasing the valence, and thus, the change of the crystalline structure with the change of the valence is localized. Formation of the internal electric field at this time is also localized.

That is, movement of the atoms with recording (change in entropy) and formation of the internal electric field over a wide range can be kept small, and thus, recording with low power consumption is made possible. Also, since the change with recording is localized, when resistance change is repeated, the characteristics can be easily maintained stable.

As a result, a nonvolatile information recording and reproducing device with high stability of a repeatable operation is provided.

In the above, in the case of NiO having a halite structure, for example, the coordination number of the first positive ion element (M ion 51) at the position of the second coordination of the first positive ion element (M ion 51) can be obtained by XAFS (X-ray Absorption Fine Structure analysis). That is, since a second-neighbor element to an M ion 51 becomes the nearest neighbor M ion 51, analysis is made by paying attention to the coordination number of the second-neighbor element by the XAFS (X-ray Absorption Fine Structure analysis) and the like.

In order to complete the recording without generation of the internal electric field over the wide range, the coordination number is preferably 80% or more and less than 100% of the case of a perfect crystal.

With the coordination number of 90% and more and less than 100% of the case of a perfect crystal, generation of the internal electric field can be kept to a small range, which is more preferable.

In the case of oxides in general, since it is difficult to obtain a crystal with no vacant site, the coordination number may be approximately 90% or less.

In order that the above operation is practically executed, a reset operation is not caused at a room temperature, that is, a sufficiently long retention time is ensured. By setting the valence of the M ion 51 at divalent, a sufficiently long retention time can be ensured.

Second Comparative Example

Figure 17:
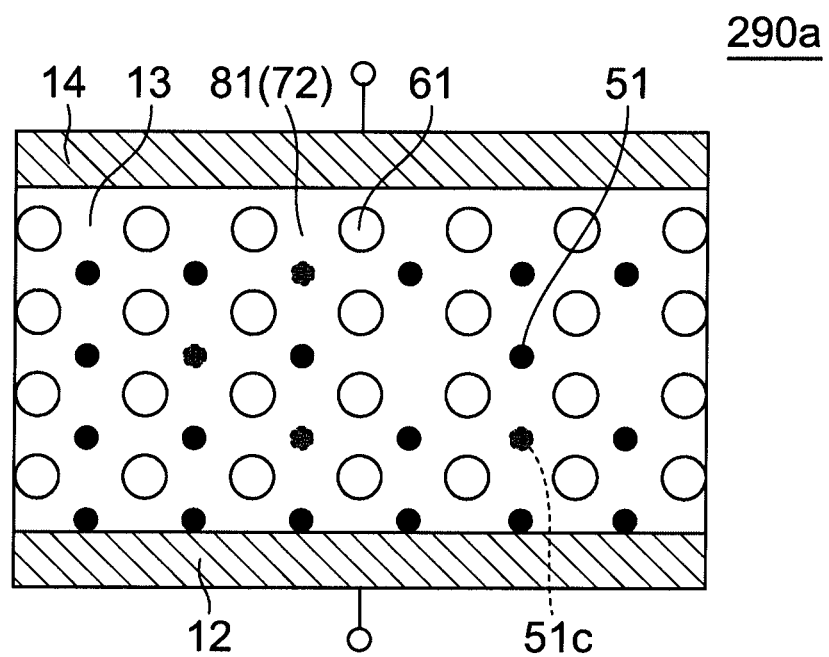
FIG. 17 is a schematic sectional view illustrating the configuration of a part of an information recording and reproducing device of a second comparative example.

FIG. 17 is a schematic sectional view illustrating the configuration of a part of an information recording and reproducing device of a second comparative example.

Figure 18:
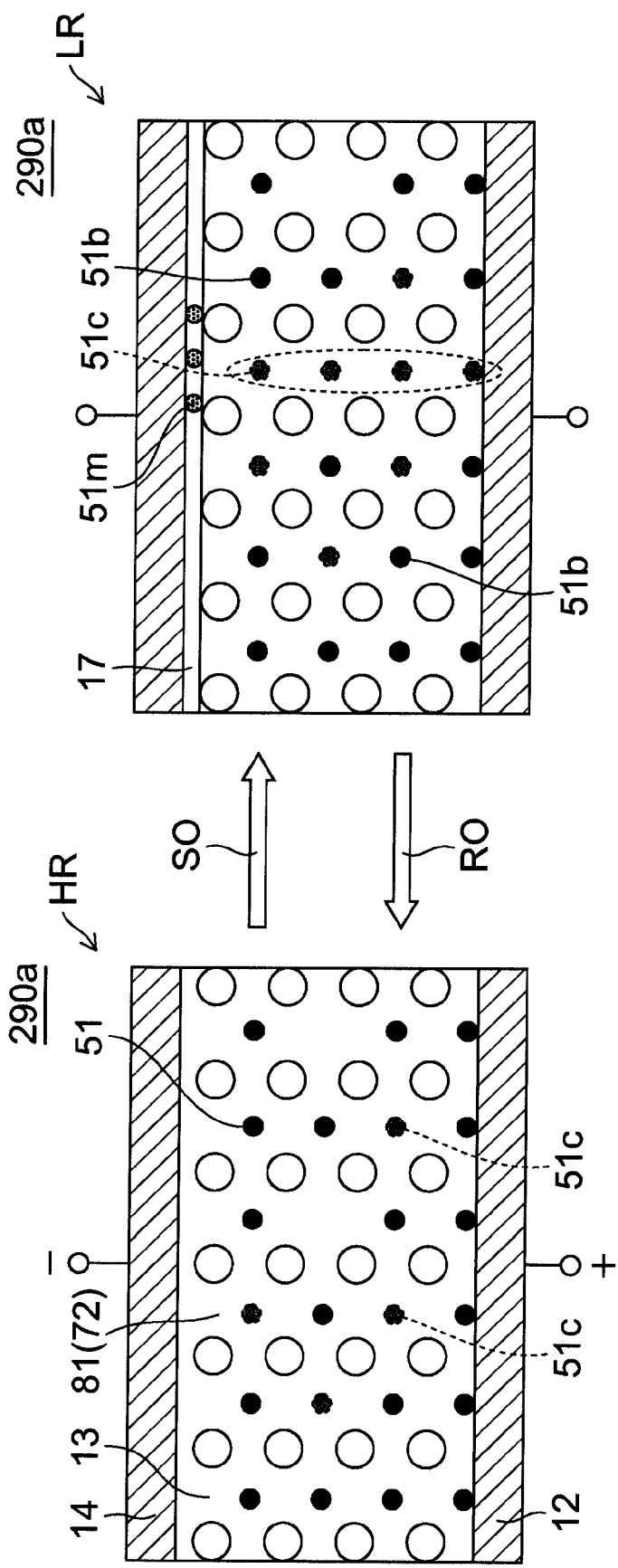
FIG. 18 is a schematic sectional view illustrating the operation of the information recording and reproducing device of the second comparative example.

FIG. 18 is a schematic sectional view illustrating the operation of the information recording and reproducing device of the second comparative example.

As illustrated in FIG. 17, in an information recording and reproducing device 290a of the second comparative example, in the recording layer 13, the coordination number of the first positive ion element at the position of the second coordination of the first positive ion element is smaller than 80% of the coordination number assuming that the second compound 72 is a perfect crystal.

That is, around the first positive ion (M ion 51), a vacancy of the first positive ion (M ion 51) is relatively large.

In this case, too, as illustrated in FIG. 18, by performing the set operation, that is, by applying a voltage to the recording layer 13 so as to generate potential gradient in the recording layer 13 in the high resistance state phase HR, a part of the M ions 51 moves in the crystal (in the recording layer 13). And the number of M ions 51 present in the vicinity of the vacant site 51c of the M ion 51 caused by the movement of the M ions 51 is small. That is, the number of M ions 51b satisfying the charge neutral condition being to be present in the vicinity of the vacant site 51c of the M ion 51 is small. Thus, it is difficult to satisfy the charge neutral condition by these M ions 51.

Therefore, since the charge neutral condition is difficult to be satisfied, generation of an internal electric field is increased, which causes unstableness. Also, since the change with recording is not localized, when the resistance change is repeated, the resistance in the high resistance state phase HR and the resistance in the low resistance state phase LR are fluctuated.

On the other hand, as already described, in the information recording and reproducing device 230 according to the embodiment, since the first positive ions (M ions 51) can exist in an amount sufficient to make up for the vacancy of the first positive ions (M ions 51) caused in the operation, the charge neutral condition can be stably satisfied, and even if the resistance change is repeated, the characteristics can be easily maintained stable.

As a result, a nonvolatile information recording and reproducing device with high stability of a repeatable operation can be provided.

Here, in order to have the above effects exerted, the amount of the vacancies of the other M ions 51 in the vicinity of the moving M ions 51 is made small. That is, even if the amount of the M ions 51 of the entire second compound 72 is sufficiently large, when many vacancies of the other M ions 51 exist locally in the vicinity of the moving M ions 51, the vacant sites 51a of the M ions 51 caused by the movement of the M ions 51 cannot be compensated for, which makes a repeatable operation unstable.

On the other hand, in the information recording and reproducing device 230 according to the embodiment, vacancies of the other M ions 51 in the vicinity of the M ions 51, that is, at the second-neighbor position, are small. That is, the coordination number of the other M ions 51 at the second-neighbor position of the M ions 51 is 80% or more and less than 100% of the coordination number when the second compound 72 is assumed to be a perfect crystal. As a result, the M ions 51 in the required amount are present in the vicinity of the M ions 51. Thus, as a result, the repeatable operation can be performed stably.

As described above, by controlling not the average amount of the M ions 51 in the second compound 72 but the coordination number of the M ions 51 at the second-neighbor position of the A ions 52, the repeatable operation is made stable.

In the information recording and reproducing device 230 according to the embodiment, too, the second layer 82 described in the second embodiment can be provided. Moreover, the first layer 81 and the second layer 82 can be alternately laminated in plural.

Fourth Embodiment

Figure 19:
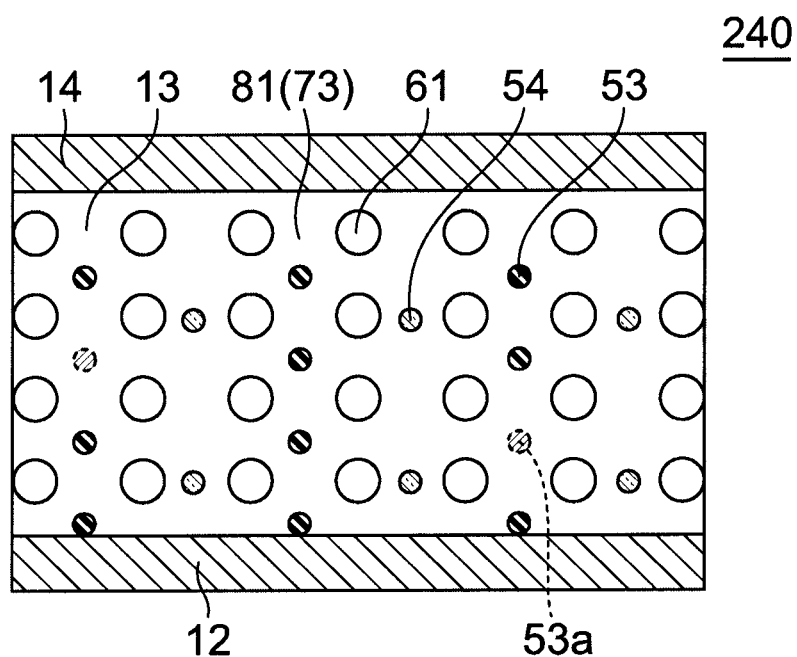
FIG. 19 is a schematic sectional view illustrating the configuration of a part of an information recording and reproducing device according to a fourth embodiment.

FIG. 19 is a schematic sectional view illustrating the configuration of a part of an information recording and reproducing device according to a fourth embodiment.

As illustrated in FIG. 19, in the recording portion of an information recording and reproducing device 240 according to the embodiment, too, the recording layer 13 is provided. In the recording portion of the specific example, the recording layer 13 is provided between the lower electrode 12 and the upper electrode 14, but as already described above, the lower electrode 12 and the upper electrode 14 can be omitted. In the following, for simplification, the description will be made assuming that the lower electrode 12 and the upper electrode 14 are provided.

In the specific example, the recording layer 13 is formed of the first layer 81 containing a third compound 73. However, as will be described later, the recording layer 13 may have a lamination structure with the first layer 81 and another layer different from the first layer 81. In the following, the case in which the recording layer 13 is formed of the first layer 81 will be described first.

The first layer 81 which becomes the recording layer 13 contains the third compound 73.

The third compound 73 is a composite compound having a plurality of positive ions in a plural valence state. And the positive ion is an ion of a transition element in a state in which at least one of the positive ions in the plural valence state having a d orbital incompletely filled with electrons.

The above transition element, that is, an element which becomes a positive ion may be at least one type of element selected from Mn, Co, and Fe.

Here, it is assumed that the positive ion of the first valence is a third positive ion 53, and the positive ion having a second valence different from the first valence is a fourth positive ion 54. Here, the second valence is assumed to be smaller than the first valence. That is, the valence of the fourth positive ion 54 is smaller than the valence of the third positive ion 53.

And the third positive ion 53 is in a state having a d orbital incompletely filled with electrons. The fourth positive ion 54 may also be in a state having a d orbital incompletely filled with electrons.

Also, the third compound 73 has the oxygen ions 61 (X ions 61) as negative ions and is a binary crystal of an oxide having an element of the positive ion (the third positive ion 53 and the fourth positive ion 54) and an oxygen element of the oxygen ion 61.

And in the third compound 73 of the recording layer 13 of the information recording and reproducing device 240 according to the embodiment, the coordination number of the third positive ion 53 at the position of the second coordination of the fourth positive ion 54 is 80% or more and less than 100% of the coordination number when the third compound 73 is assumed to be a perfect crystal.

That is, around the fourth positive ions 54, the amount of vacant sites 53a of the third positive ions 53 is relatively small, and as will be described, there are sufficient third positive ions 53 to compensate for the vacancy of the fourth positive ions 54 generated in the operation.

As a result, recording can be completed without generating an internal electric field over a wide range. And a nonvolatile information recording and reproducing device with high stability of a repeatable operation is provided.

Figure 20:
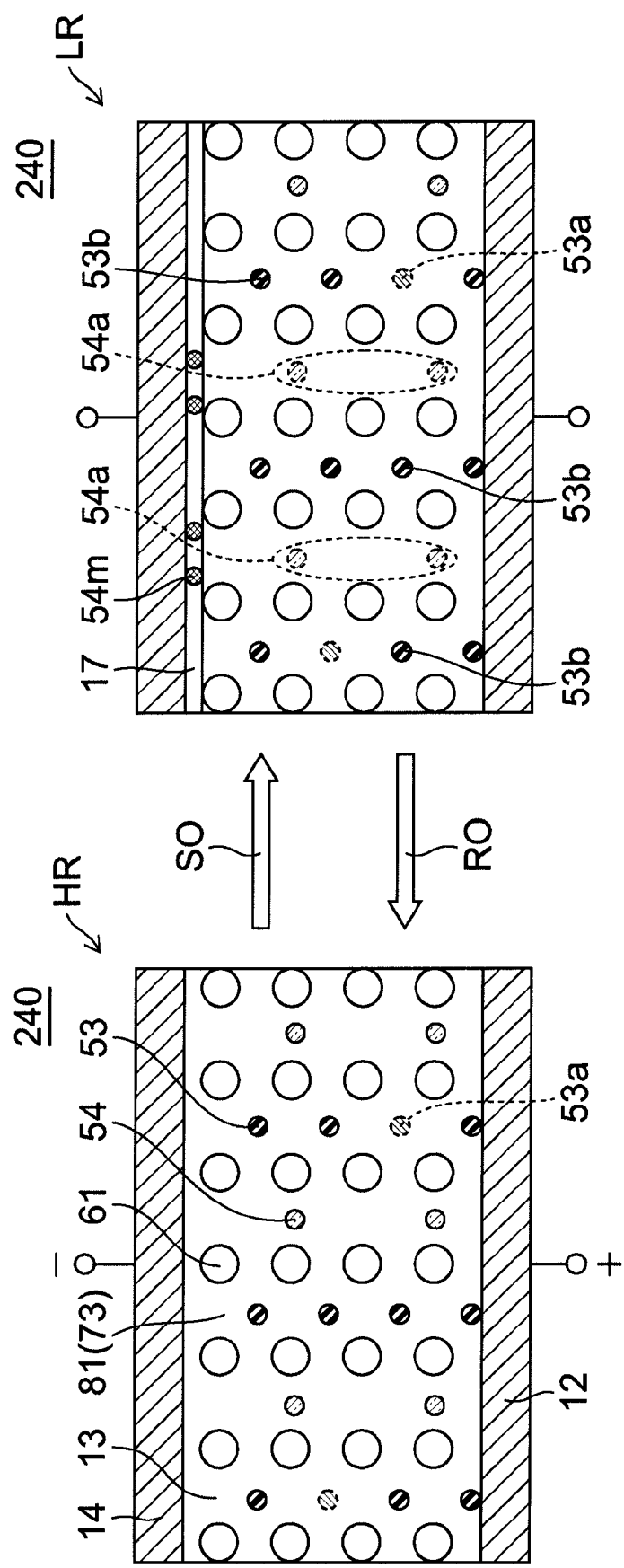
FIG. 20 is a schematic sectional view illustrating the operation of the information recording and reproducing device according to the fourth embodiment.

FIG. 20 is a schematic sectional view illustrating the operation of the information recording and reproducing device according to the fourth embodiment.

As illustrated in FIG. 20, in the high resistance state phase HR, if a voltage is applied to the recording layer 13 so as to generate a potential gradient in the recording layer 13, a part of the fourth positive ions 54 moves in the crystal (in the recording layer 13).

And a part of the fourth positive ions 54 in the recording layer 13 moves to the side of the upper electrode (cathode) 14, and the number of the positive ions (the third positive ions 53 and the fourth positive ions 54) in the recording layer 13, which is a crystal, is relatively decreased as compared with the oxygen ion 61.

The fourth positive ions 54 which have moved to the side of the upper electrode 14 receive electrons from the upper electrode 14, precipitate as metal atoms 54m, which are metal, and form the metal layer 17.

Therefore, in a region close to the upper electrode 14, since the fourth positive ions 54 are reduced and behave as metal, their electric resistance is largely decreased.

On the other hand, inside the recording layer 13, the amount of the oxygen ions 61 become excessive, and as a result, the valence of the third positive ions 53 which are left inside the recording layer 13 is raised. At this time, by selecting the third positive ion 53 so that the electric resistance is lowered when the valence is raised, the electric resistance is decreased by movement of the fourth positive ions 54 both in the metal layer 17 and the recording layer 13.

That is, by using Mn, Co, Fe and the like as an element which becomes the third positive ion 53 (and the fourth positive ion 54), the electric resistance is lowered when the valence is raised.

As a result, the entire recording layer 13 is phase-changed to the low resistance state phase LR. That is, information recording is performed. This is referred to as the set operation SO.

Then, the reproduction of the recorded information is easily performed by applying a voltage pulse, for example, to the recording layer 13 and detecting a resistance value of the recording layer 13. At this time, the height of the voltage pulse is set at a low value that would not cause movement of the A ions 52.

On the other hand, for the reset operation RO, the already described method can be used.

As described above, the information recording and reproducing device 240 according to the embodiment performs the recording operation, that is, the set operation SO and the reset operation RO.

In the recording operation as described above, in the recording layer 13 of the information recording and reproducing device 240 according to the embodiment, the coordination number of the third positive ion 53 element at the position of the second coordination of the fourth positive ion 54 element is 80% or more and less than 100% of the coordination number when the third compound 73 is assumed to be a perfect crystal, and around the fourth positive ions 54, a vacancy of the third positive ions 53 is relatively small. As a result, there are sufficient third positive ions 53 to compensate for the vacancy of the fourth positive ions 54 generated by the recording operation.

That is, in the vicinity of a vacant site 54a of the fourth positive ion 54 caused by movement of the fourth positive ion 54, the third positive ions 53 can exist. That is, in the vicinity of the vacant site 54a of the fourth positive ion 54, the third positive ions 53b that satisfy a condition of a charge neutral can be present.

That is, if this recording operation is to be performed, when the fourth positive ions 54 move, the third positive ions 53 which are left in the crystalline structure (inside the recording layer 13) raise the valence. And if the third positive ions 53 are present in the vicinity of the vacant site 54a of the fourth positive ions 54 caused by movement of the fourth positive ions 54, the third positive ions 53 can satisfy the charge neutral condition in the crystalline structure (inside the recording layer 13) by raising the valence, and thus, the change of the crystalline structure with the change of the valence is localized. Formation of the internal electric field at this time is also localized.

That is, movement of the atoms with recording (change in entropy) and formation of the internal electric field over a wide range can be kept small, and thus, recording with low power consumption is made possible. Also, since the change with recording is localized, when resistance change is repeated, the characteristics can be easily maintained stable.

As a result, a nonvolatile information recording and reproducing device capable of performing a stable repeatable repeatedly can be realized.

Here, in order to have the above effects exerted, the amount of the vacancies of the third positive ions 53 in the vicinity of the moving fourth positive ions 54 is made small. That is, even if the amount of the third positive ions 53 of the entire third compound 73 is sufficiently large, when many vacancies of the third positive ions 53 exist locally in the vicinity of the moving fourth positive ions 54, the vacant sites 54a of the fourth positive ions 54 caused by the movement of the fourth positive ions 54 cannot be compensated for, which makes a repeatable operation unstable.

On the other hand, in the information recording and reproducing device 240 according to the embodiment, vacancies of the third positive ions 53 in the vicinity of the fourth positive ions 54, that is, at the second-neighbor position are small. That is, the coordination number of the third positive ions 53 at the second-neighbor position of the fourth positive ions 54 is 80% or more and less than 100% of the coordination number when the third compound 73 is assumed to be a perfect crystal. As a result, the third positive ions 53 in the required amount are present in the vicinity of the fourth positive ions 54. Thus, as a result, the repeatable operation can be performed stably.

As described above, by controlling not the average amount of the third positive ions 53 in the third compound 73 but the coordination number of the M ions 51 at the second-neighbor position of the A ions 52, the repeatable operation is made stable.

In the above, the first valence and the second valence can include divalent and trivalent.

The valence in the above fourth positive ion 54 can be divalent. And the valence in the above third positive ion 53 can be trivalent.

In the information recording and reproducing device 240 according to the embodiment, too, the second layer 82 described in the second embodiment can be provided. Moreover, the first layer 81 and the second layer 82 may be alternately laminated in plural.

Fifth Embodiment

A fifth embodiment relates to a probe memory type information recording and reproducing device.

Figure 21:
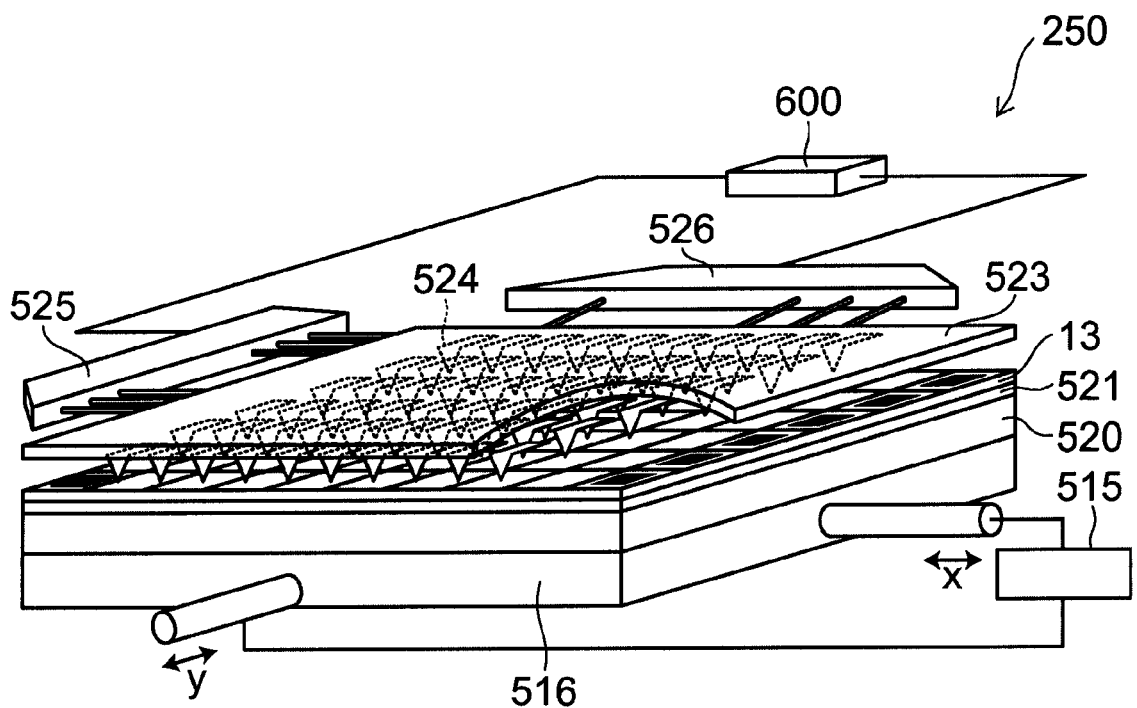
FIG. 21 is a schematic perspective view illustrating the configuration of an information recording and reproducing device according to a fifth embodiment.

FIG. 21 is a schematic perspective view illustrating the configuration of the information recording and reproducing device according to the fifth embodiment.

Figure 22:
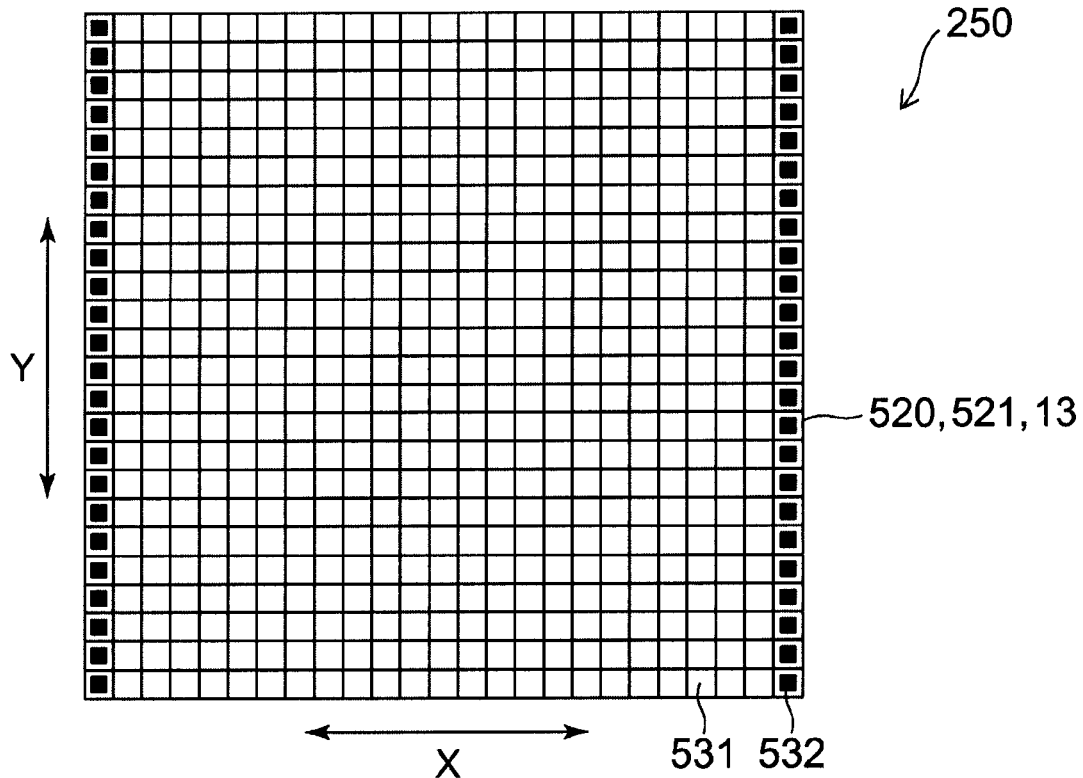
FIG. 22 is a schematic plan view illustrating the configuration of the information recording and reproducing device according to the fifth embodiment.

FIG. 22 is a schematic plan view illustrating the configuration of the information recording and reproducing device according to the fifth embodiment.

As illustrated in FIGS. 21 and 22, in the information recording and reproducing device 250 according to the fifth embodiment, on an XY scanner 516, the recording layer 13 provided on an electrode 521 is arranged. And a probe array is arranged in the form opposing the recording layer 13.

The probe array has a substrate 523 and a plurality of probes (heads) 524 arranged in an array state on one face side of the substrate 523. Each of the plurality of probes 524 is formed of a cantilever, for example, and is driven by multiplex drivers 525 and 526.

Each of the plurality of probes 524 can be individually operated using a micro-actuator in the substrate 523 but is capable of making an access to a data area 531 of a storage medium (recording layer 13) by making all of them perform the same operation.

First, by using the multiplex drivers 525 and 526, all the probes 524 are reciprocally operated in a constant cycle in the X direction so that position information in the Y direction from a servo area 532 of the storage medium (recording layer 13) is read out. The position information in the Y direction is transferred to a driver 515.

The driver 515 drives the XY scanner 516 on the basis of this position information, moves the storage medium (recording layer 13) in the Y direction and positions the storage medium (recording layer 13) and the probe.

When positioning of the both is completed, data reading or writing is performed at the same time and continuously for all the probes 524 on the data area 531.

The data reading and writing are continuously performed since the probes 524 are reciprocally operated in the X direction. Also, the data reading and writing are performed for one line each of the data area 531 by sequentially changing the position of the recording layer 13 in the Y direction.

It may be so configured that the recording layer 13 is reciprocally operated in the X direction in a constant cycle so as to read out the position information from the storage medium (recording layer 13) and to move the probes 524 in the Y direction.

The recording layer 13 is provided on an electrode 521 provided on the substrate 520, for example.

The recording layer 13 has the plurality of data areas 531 and the servo areas 532 arranged at both ends of the plurality of data areas 531 in the X direction, respectively. The plurality of data areas 531 form a major part of the recording layer 13.

In the servo area 532, a servo burst signal is stored. The servo burst signal indicates the position information in the Y direction in the data area 531.

In the recording layer 13, in addition to the above information, an address area in which address data is stored and a preamble area for synchronization are further arranged.

The data and the servo burst signal are stored in the recording layer 13 as a memory bit (electric resistance fluctuation). The "1" and "0" information of the memory bit is read out by detecting electric resistance of the recording layer 13.

In the example, one probe (head) is provided for one data area 531, and one probe is provided for one servo area 532.

The data area 531 includes a plurality of tracks. The track of the data area 531 is specified by an address signal read out of the address area. Also, the servo burst signal read out of the servo area 532 is to eliminate a reading error of the memory bit by moving the probe 524 to the center of the track.

Here, by making the X direction correspond to a down track direction and the Y direction to a track direction, use of a head position control technology of the HDD is made possible.

Then, each of the probes 524 is connected to a driving unit 600 through the multiplex drivers 525 and 526, for example. The driving unit 600 supplies at least one of a voltage and a current for information recording to each of the probes 524. Then, the recording layer 13 transits between the high resistance state and the low resistance state by the voltage and the current supplied through the probe 524. Also, the driving unit 600 detects the high resistance state and the low resistance state recorded in the recording layer 13 and reads the recorded information.

The information recording and reproducing device 250 of the above configuration is provided with the driving unit 600 that generates a phase change in the recording layer 13 so as to record information by at least one of applying a voltage to the recording layer 13 and applying a current to the recording layer 13.

Also, the information recording and reproducing device 250 is further provided with the probe 524 provided with the recording layer 13, and the driving unit 600 performs at least one of voltage application and current application to a recording unit of the recording layer 13 through the probe 524. As a result, a phase change is generated in the recording layer 13, and information is recorded.

For the recording layer 13, at least one of various types of the recording layers described in the first to fourth embodiments can be used.

The driving unit 600 may include the above driver 515 and the XY scanner 516 or conversely, the driving unit 600 may be included in the above driver 515 and the XY scanner 516.

As a result, in the probe memory type information recording and reproducing device 250 according to the embodiment, too, a nonvolatile information recording and reproducing device capable of performing a stable operation repeatedly by the effects described in connection with the above described first to fourth embodiments can be provided.

Sixth Embodiment

A sixth embodiment relates to a flash memory type information recording and reproducing device.

FIG. 23 is a schematic sectional view illustrating the configuration of a part of the information recording and reproducing device according to the sixth embodiment.

FIG. 24 is a schematic sectional view illustrating the operation of the information recording and reproducing device according to the sixth embodiment.

As illustrated in FIG. 23, in an information recording and reproducing device 260 according to the embodiment, a flash memory type memory cell is provided, and this memory cell is formed of an MIS (metal-insulator-semiconductor) transistor.

That is, on a surface region of a semiconductor substrate 41, a diffusion layer 42 is formed. On a channel region between the diffusion layers 42, a gate insulation layer 43 is formed. On the gate insulation layer 43, the recording layer 13 according to the example of is formed. On the recording layer 13, a control gate electrode 45 is formed.

The semiconductor substrate 41 may be a well region, and the semiconductor substrate 41 and the diffusion layer 42 have conductivities opposite to each other. The control gate electrode 45 becomes a word line and is made of conductive polysilicon, for example.

The recording layer 13 can have at least one of the configurations described in the first to fourth embodiments.

In this case, a driving unit, not shown, is connected to and provided in the control gate electrode 45. The driving unit performs at least one of application of a voltage to the recording layer 13 and application of a current to the recording layer 13 through the control gate electrode 45.

In the above, one of the above-described upper electrode 14 and the lower electrode 12 provided to contact with the recording layer 13 may be also used as the control gate electrode 45 at the same time, for example.

As illustrated in FIG. 24, in the set (writing) operation SO, a potential V1 is given to the control gate electrode 45, while a potential V2 is given to the semiconductor substrate 41.

A difference between the potential V1 and the potential V2 is an magnitude sufficient for the recording layer 13 to change its phase, that is, to change its resistance. However, polarity of the potential difference is not particularly limited. That is, either one of V1>V2 and V1<V2 may be applied.

For example, supposing that the recording layer 13 is in the high resistance state phase HR in the initial state (reset state), since it can be substantially considered that the gate insulation layer 43 becomes thick, a threshold value of the memory cell (MIS transistor) becomes high.

If the recording layer 13 is changed from this state to the low resistance state phase LR by giving the potentials V1 and V2, since it substantially means that the gate insulation layer 43 has become thin, the threshold value of the memory cell (MIS transistor) becomes low.

Although the potential V2 is given to the semiconductor substrate 41, the potential V2 may be transferred from the diffusion layer 42 to a channel region of the memory cell instead.

In the same figure, an arrow Ae indicates movement of electrons and an arrow Ai indicates movement of ions.

On the other hand, in the reset (erasing) operation RO, a potential V1' is given to the control gate electrode 45, a potential V3 is given to one of the diffusion layer 42, and a potential V4 (<V3) is given to the other of the diffusion layer 42.

The potential V1' is set to a value exceeding the threshold value of the memory cell in the set state.

At this time, the memory cell is turned on, electrons flow from the other to the one of the diffusion layer 42, and hot electrons are generated. Since these hot electrons are injected into the recording layer 13 via the gate insulation layer 43, the temperature of the recording layer 13 is raised.

As a result, the recording layer 13 is changed from the low resistance state phase LR to the high resistance state phase, which means that the gate insulation layer 43 has substantially become thick, the threshold value of the memory cell (MIS transistor) is increased.

As described above, due to the operation similar to a flash memory, the threshold value of the memory cell can be changed and can be used as an information recording and reproducing device.

At this time, in the information recording and reproducing device 260 according to the embodiment, since at least one of the recording layers 13 described in the first to fourth embodiments is used as the recording layer 13, a nonvolatile information recording and reproducing device capable of performing a stable operation repeatedly can be provided.

Figure 25:
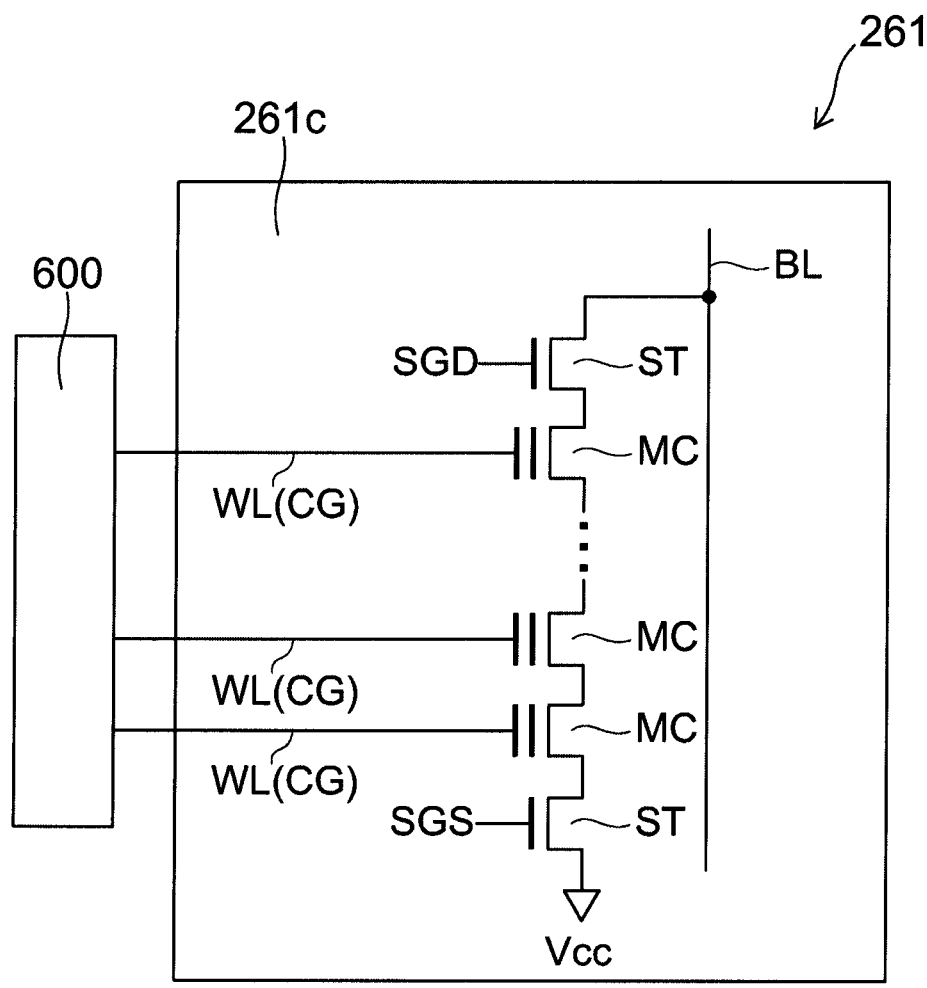
FIG. 25 is a schematic diagram illustrating the configuration of a part of another information recording and reproducing device according to the sixth embodiment.

FIG. 25 is a schematic diagram illustrating the configuration of a part of another information recording and reproducing device according to a sixth embodiment.

Figure 26:
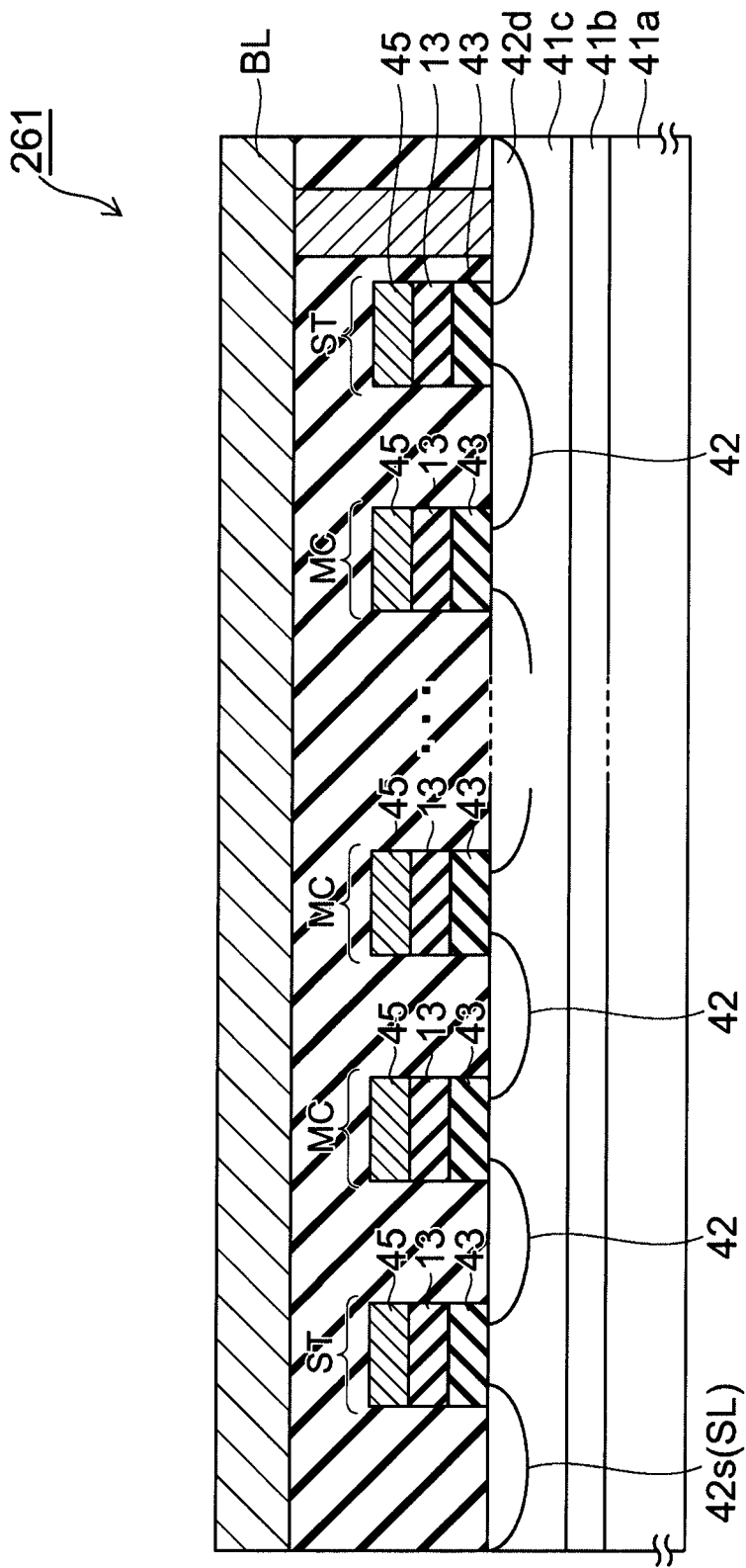
FIG. 26 is a schematic sectional view illustrating a part of another information recording and reproducing device according to the sixth embodiment.

FIG. 26 is a schematic sectional view illustrating a part of another information recording and reproducing device according to the sixth embodiment.

That is, another information recording and reproducing device 261 according to the embodiment is an NAND type flash memory, and FIG. 25 illustrates a circuit diagram of an NAND cell unit 261c, and FIG. 26 illustrates a structure of the NAND cell unit 261c.

As illustrated in FIGS. 25 and 26, in a p-type semiconductor substrate 41a, an n-type well region 41b and a p-type well region 41c are formed. In the p-type well region 41c, the NAND cell unit 261c is formed.

The NAND cell unit 261c includes an NAND string formed of a plurality of memory cells MC connected in series and two select-gate transistors ST connected one each to the both ends thereof.

The memory cell MC and the select-gate transistor ST share the same structure. Specifically, each of them includes the n-type diffusion layer 42, the gate insulation layer 43 on the channel region between the n-type diffusion layers 42, the recording layer 13 on the gate insulation layer 43, and the control gate electrode 45 on the recording layer 13.

Each of the control gate electrodes 45 (CG) is electrically connected to the driving unit 600. The driving unit 600 may be provided on the substrate on which the NAND cell unit 261c is provided or may be provided on another substrate.

The state of the recording layer 13 of the memory cell MC (the high resistance state phase HR and the low resistance state phase LR) can be changed by the above-described operation. On the other hand, the recording layer 13 of the select-gate transistor ST is fixed to a set state, that is, to the low resistance state phase LR.

One of the select-gate transistors ST is connected to a source line SL, while the other is connected to a bit line BL.

Before the set (writing) operation SO, all the memory cells in the NAND cell unit 261c are assumed to be in the reset state (large resistance).

The set (writing) operation SO is performed from the memory cell MC on the source line SL side to the memory cell on the bit line BL side one by one in order.

V1 (positive potential) is given as a writing potential to the selected word line (control gate electrode) WL, and $V_{pass}$ is given as a transfer potential (potential to turn on the memory cell MC) to the non-selected word line WL.

By turning off the select-gate transistor ST on the source line SL side and by turning on the select-gate transistor ST on the bit line BL side, the program data is transferred to the channel region of the memory cell MC selected from the bit line BL.

For example, a writing prohibition potential (a potential substantially equal to V1, for example) is transferred to the channel region of the selected memory cell MC when the program data is "1" so that the resistance value of the recording layer 13 of the selected memory cell MC does not change from the high state to the low state.

Also, if the program data is "0", V2 (<V1) is transferred to the channel region of the selected memory cell MC so that the resistance value of the recording layer 13 of the selected memory cell MC is changed from the high state to the low state.

On the other hand, in the reset (erasing) operation RO, V1' is given to all the word lines (control gate electrodes) WL, for example, so as to turn on all the memory cells MC in the NAND cell unit 261c. Also, the two select-gate transistors ST are turned on, V3 is given to the bit line BL, and V4 (<V3) is given to the source line SL.

At this time, since the hot electrons are injected to the recording layers 13 in all the memory cells MC in the NAND cell unit 261c, the reset operation is performed at the same time for all the memory cells MC in the NAND cell unit 261c.

For the reading operation, a reading potential (positive potential) is given to the selected word line (control gate electrode) WL, and a potential which always turns on the memory cell MC is given to the non-selected word line (control gate electrode) WL whether the data is "0" or "1".

Also, the two select-gate transistors ST are turned on, and a reading current is supplied to the NAND string.

Since the selected memory cell MC is turned on or off depending on the value of the data stored therein, if the reading potential is applied, by detecting a change in the reading current, for example, the data can be read.

In the structure illustrated in FIG. 26, the select-gate transistor ST has the same structure as that of the memory cell MC, but the structure may be deformed as follows.

Figure 27:
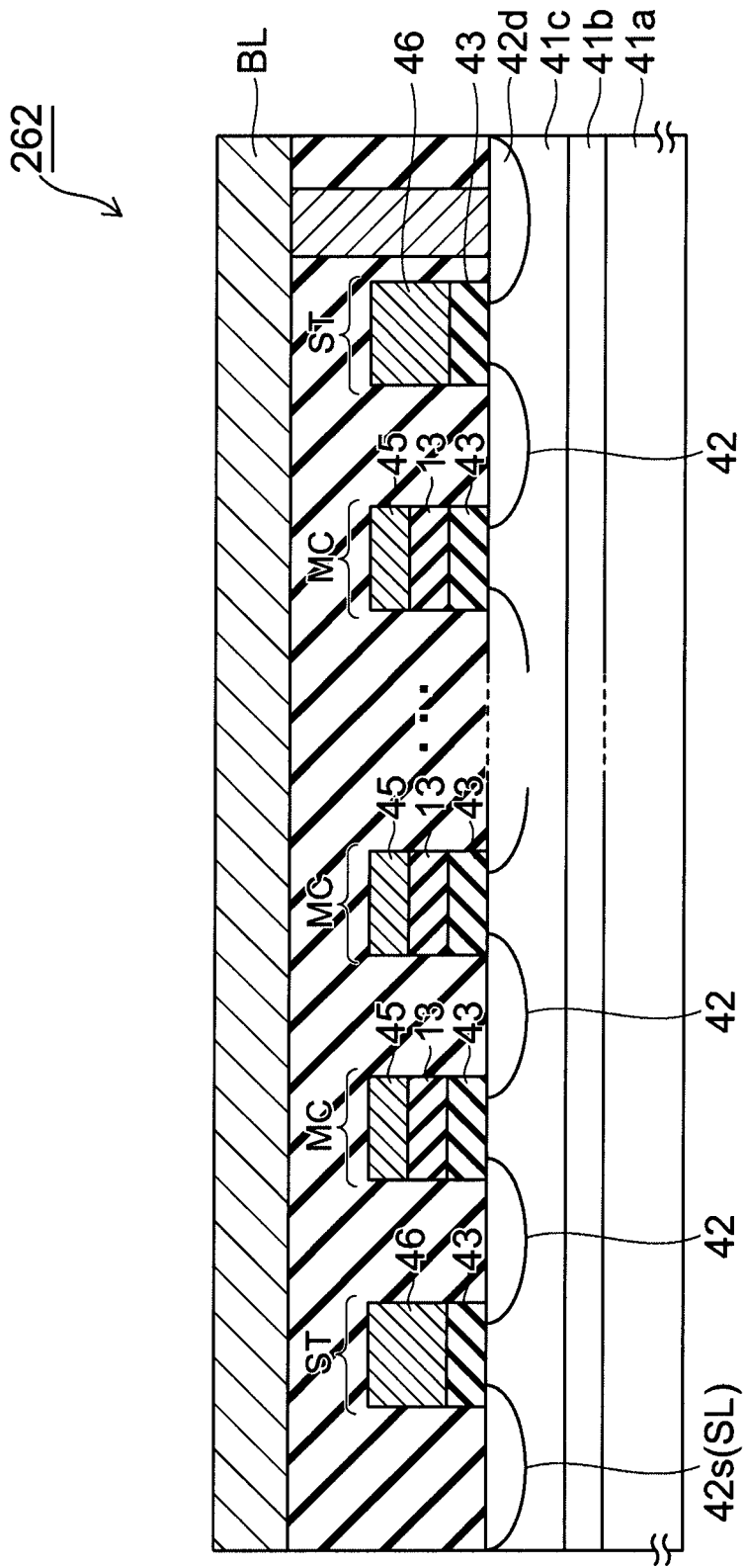
FIG. 27 is a schematic sectional view illustrating a part of an information recording and reproducing device of a variation according to the sixth embodiment.

FIG. 27 is a schematic sectional view illustrating a part of an information recording and reproducing device of a variation according to the sixth embodiment.

As illustrated in FIG. 27, in an information recording and reproducing device 262 of the variation according to the embodiment, in the select-gate transistor ST, a recording layer is not formed but a usual MIS transistor is used. As described above, the structure of the select-gate transistor ST is arbitrary.

Figure 28:
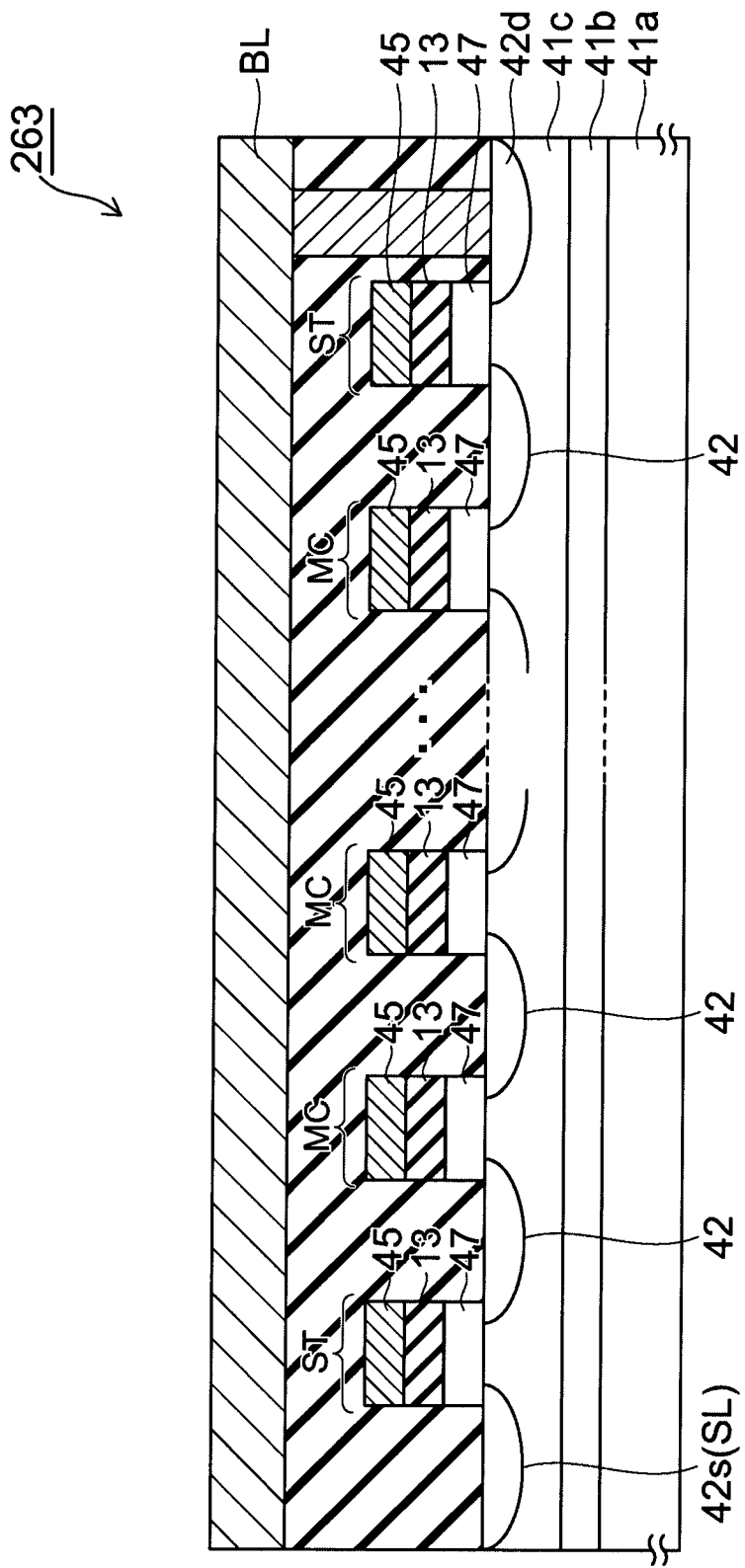
FIG. 28 is a schematic sectional view illustrating a part of an information recording and reproducing device of a variation according to the sixth embodiment.

FIG. 28 is a schematic sectional view illustrating a part of an information recording and reproducing device of a variation according to the sixth embodiment.

As illustrated in FIG. 28, in an information recording and reproducing device 263 of the variation according to the embodiment, the gate insulation layers of the plurality of memory cells MC constituting the NAND string are replaced by p-type semiconductor layers 47.

With progress of large-scale integration and miniaturization of the memory cell MC, the p-type semiconductor layer 47 is filled by a depletion layer in a state in which a voltage is not applied.

In the set (writing) operation SO, a positive writing potential (3.5 V, for example) is given to the control gate electrode 45 of the selected memory cell MC and also, a positive transfer potential (1 V, for example) is given to the control gate electrode 45 of the non-selected memory cell MC.

At this time, the surfaces of the p-type well regions 41c of the plurality of memory cells MC in the NAND string are reversed from the p-type to the n-type, and a channel is formed.

Then, as described above, by turning on the select-gate transistor ST on the bit line BL side and by transferring the program data "0" to the channel region of the memory cell MC selected from the bit line BL, the set operation can be performed.

On the other hand, in the reset (erasing) operation RO, by giving a negative erasing potential (−3.5 V, for example) to all the control gate electrodes 45 and by giving a ground potential (0 V) to the p-type well region 41c and the p-type semiconductor layer 47, for example, the operation can be performed at the same time for all the memory cells MC constituting the NAND string.

In the reading operation, a positive reading potential (0.5 V, for example) is given to the control gate electrode 45 of the selected memory cell MC and a transfer potential (1 V, for example) which always turns on the memory cell MC whether the data is "0" or "1" is given to the control gate electrode 45 of the non-selected memory cell MC.

However, it is assumed that the threshold voltage Vth"1" of the memory cell MC in the "1" state is within a range of 0 V<Vth"1"<0.5 V, and the threshold voltage Vth"0" of the memory cell MC in the "0" state is within a range of 0.5 V<Vth"0"<1 V.

Also, the two select-gate transistors ST are turned on, and a reading current is supplied to the NAND string.

In such a state, a current amount flowing through the NAND string is changed in accordance with the value of data stored in the selected memory cell MC, and by detecting the change, the data can be read.

In this variation, it is desirable that a hole-dope amount of the p-type semiconductor layer 47 is larger than that of the p-type well region 41c and that the Fermi level of the p-type semiconductor layer 47 is deeper than that of the p-type well region 41c by approximately 0.5 V.

This is because, when a positive potential is given to the control gate electrode 45, reversing from the p-type to the n-type is to be started from the surface portion of the p-type well region 41c between the n-type diffusion layers 42 so that a channel is formed.

As a result, in the writing, for example, the channel of the non-selected memory cell MC is formed only in an interface between the p-type well region 41c and the p-type semiconductor layer 47, while in the reading, the channels of the plurality of memory cells MC in the NAND string are formed only in the interface between the p-type well region 41c and the p-type semiconductor layer 47.

That is, even if the recording layer 13 of the memory cell MC is in the low resistance state phase LR, the diffusion layer 42 and the control gate electrode 45 are not short-circuited.

Figure 29:
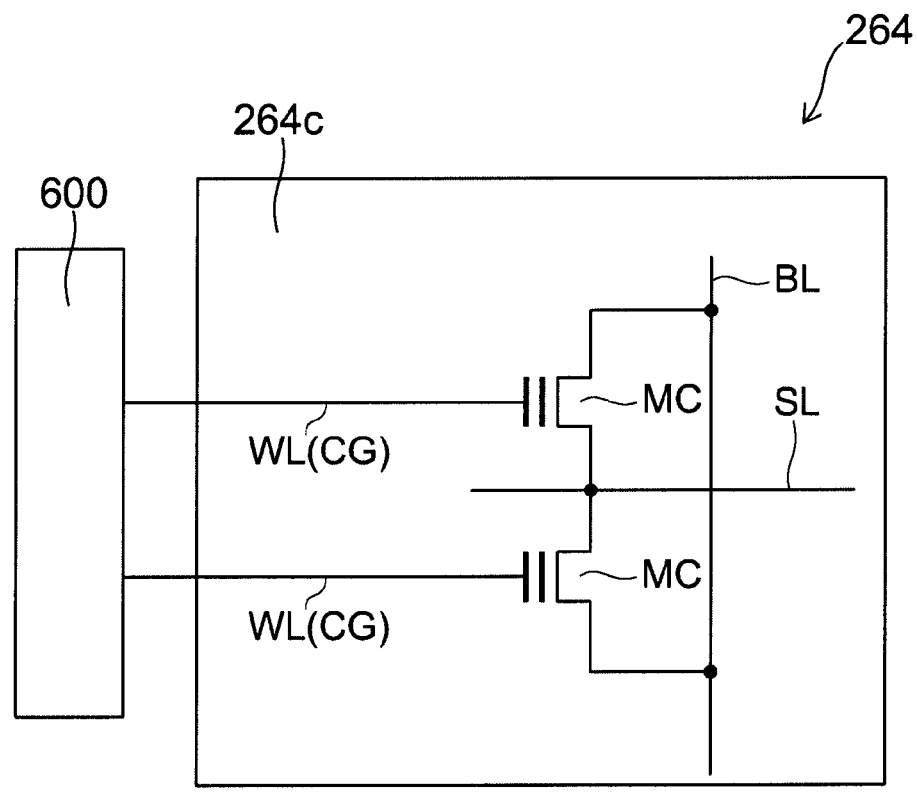
FIG. 29 is a schematic diagram illustrating the configuration of another information recording and reproducing device according to the sixth embodiment of the invention.

FIG. 29 is a schematic diagram illustrating the configuration of another information recording and reproducing device according to the sixth embodiment.

Figure 30:
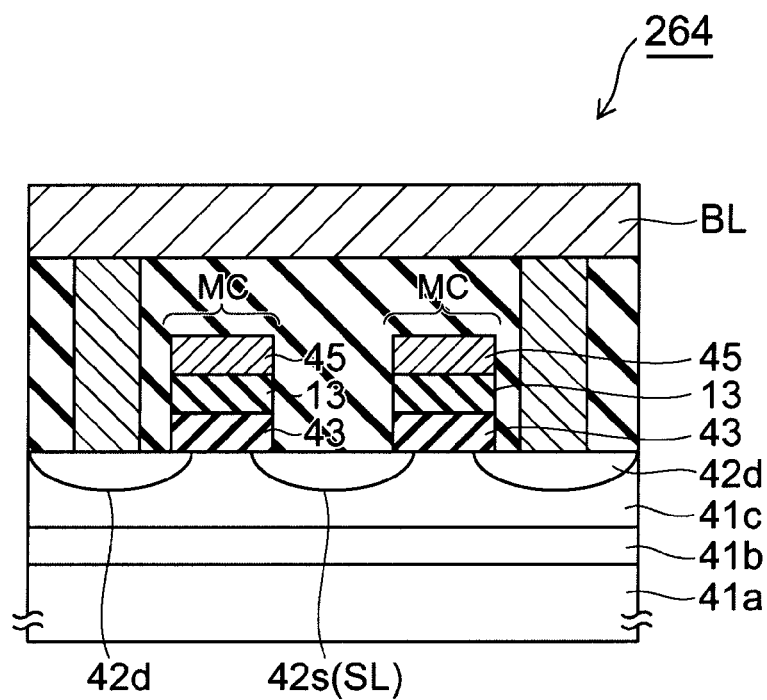
FIG. 30 is a schematic sectional view illustrating a part of another information recording and reproducing device according to the sixth embodiment.

FIG. 30 is a schematic sectional view illustrating a part of another information recording and reproducing device according to the sixth embodiment.

That is, another information recording and reproducing device 264 according to the embodiment is an NOR-type flash memory, and FIG. 29 illustrates a circuit diagram of an NOR-type cell unit 264c, while FIG. 30 illustrates a structure of the NOR cell unit 264c.

As illustrated in FIGS. 29 and 30, in the p-type semiconductor substrate 41a, the n-type well region 41b and the p-type well region 41c are formed. In the p-type well region 41c, an NOR cell is formed.

The NOR cell is constituted by one memory cell (MIS transistor) MC connected between the bit line BL and the source line SL.

The memory cell MC includes the n-type diffusion layer 42, the gate insulation layer 43 on the channel region between the n-type diffusion layers 42, the recording layer 13 on the gate insulation layer 43, and the control gate electrode 45 on the recording layer 13.

Each of the control gate electrodes 45 (CG) is electrically connected to the driving unit 600. The driving unit 600 may be provided on a substrate on which the NOR cell unit 264c is provided or may be provided on a substrate different from that.

The state (high resistance state phase HR and the low resistance state phase LR) of the recording layer 13 of the memory cell MC can be changed by the above-described operation.

Figure 31:
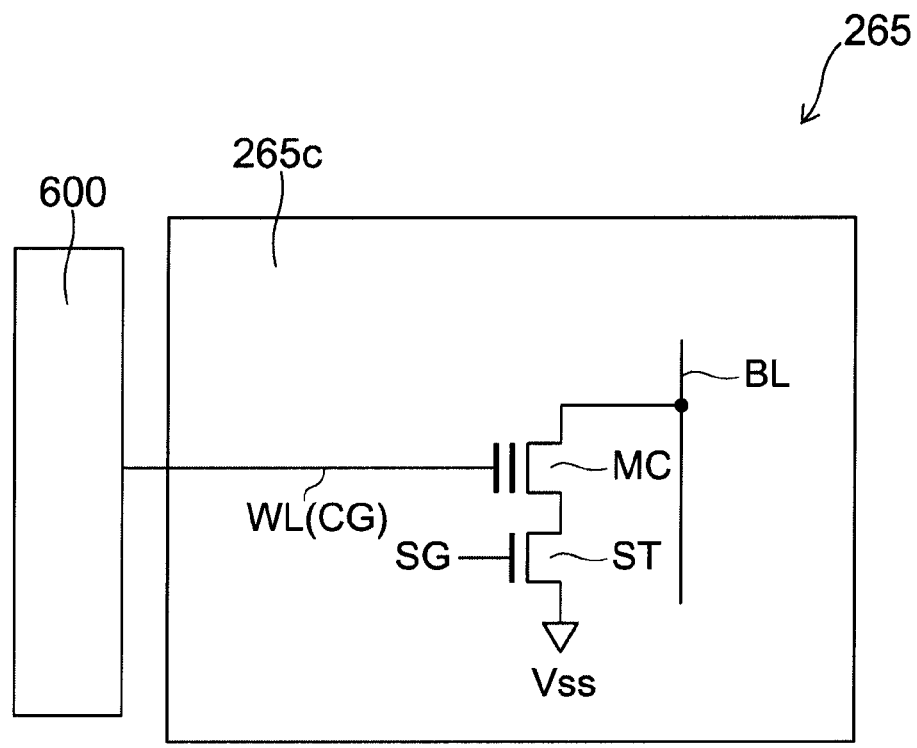
FIG. 31 is a schematic diagram illustrating the configuration of the part of another information recording and reproducing device according to the sixth embodiment.

FIG. 31 is a schematic diagram illustrating the configuration of the part of another information recording and reproducing device according to the sixth embodiment.

Figure 32:
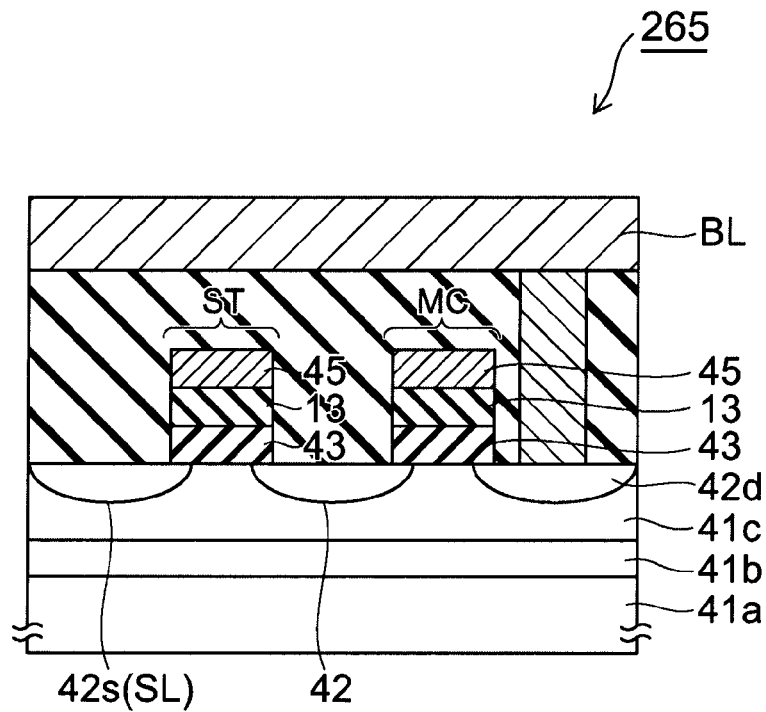
FIG. 32 is a schematic sectional view illustrating the part of another information recording and reproducing device according to the sixth embodiment.

FIG. 32 is a schematic sectional view illustrating the part of another information recording and reproducing device according to the sixth embodiment.

That is, another information recording and reproducing device 265 according to the embodiment is a 2-track flash memory, FIG. 31 illustrates a circuit diagram of a 2-track cell unit 265c, and FIG. 32 illustrates a structure of the 2-track cell unit 265c.

As illustrated in FIGS. 31 and 32, the 2-track cell unit 265c has a cell structure having both the characteristic of the NAND cell unit and the characteristic of the NOR cell.

In the p-type semiconductor substrate 41a, the n-type well region 41b and the p-type well region 41c are formed. In the p-type well region 41c, the 2-track cell unit 265c is formed.

The 2-track cell unit 265c includes one serially connected memory cell MC and one select-gate transistor ST.

The memory cell MC and the select-gate transistor ST share the same structure. Specifically, each of them includes the n-type diffusion layer 42, the gate insulation layer 43 on the channel region between the n-type diffusion layers 42, the recording layer 13 on the gate insulation layer 43, and the control gate electrode 45 on the recording layer 13.

Each of the control gate electrodes 45 (CG) is electrically connected to the driving unit 600. The driving unit 600 may be provided on a substrate on which the 2-track cell unit 265c is provided or may be provided on a substrate different from that.

The state (high resistance state phase HR and the low resistance state phase LR) of the recording layer 13 of the memory cell MC can be changed by the above-described operation. On the other hand, the recording layer 13 of the select-gate transistor ST is fixed to a set state, that is, to the low resistance state phase LR.

The select-gate transistor ST is connected to the source line SL, and the memory cell MC is connected to the bit line BL.

The state (high resistance state phase HR and the low resistance state phase LR) of the recording layer 13 of the memory cell MC can be changed by the above-described operation.

In the structure illustrated in FIG. 32, the select-gate transistor ST has the same structure as that of the memory cell MC, but the structure may be deformed as follows.

Figure 33:
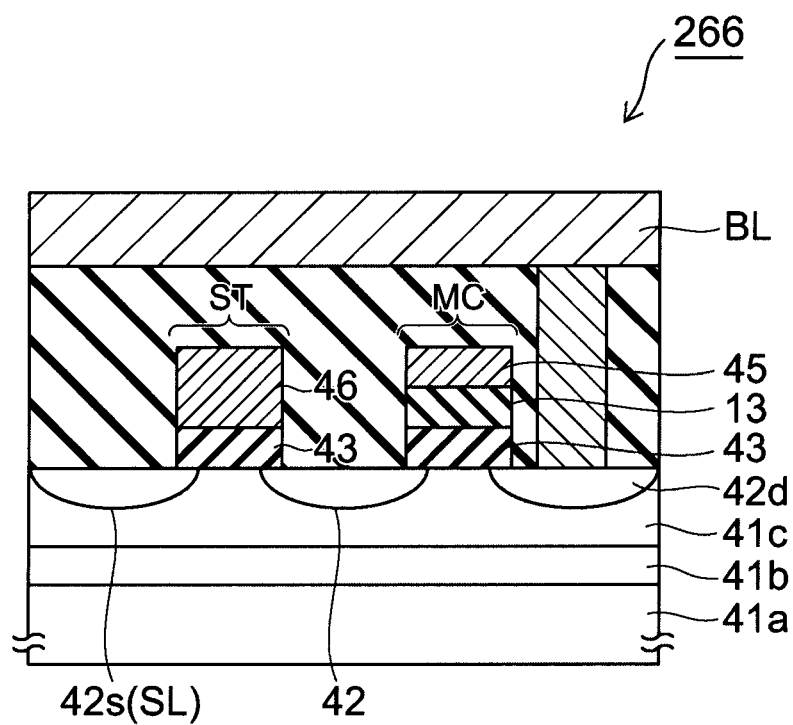
FIG. 33 is a schematic sectional view illustrating a part of an information recording and reproducing device of a variation according to the sixth embodiment.

FIG. 33 is a schematic sectional view illustrating a part of an information recording and reproducing device of a variation according to the sixth embodiment.

As illustrated in FIG. 33, in an information recording and reproducing device 266 of the variation according to the embodiment, a recording layer is not formed but a usual MIS transistor is used in the select-gate transistor ST. As described above, the structure of the select-gate transistor ST is arbitrary.

According to the embodiments, a nonvolatile information recording and reproducing device with high stability of a repeatable operation is provided.

The embodiment of the invention has been described with reference to the examples. However, the invention is not limited to these examples. For instance, the specific configurations of the components constituting the information recording and reproducing device can be suitably selected from conventional ones by those skilled in the art, and such configurations are encompassed within the scope of the invention as long as they can also implement the invention and achieve similar effects.

Components in two or more of the specific examples can be combined with each other as long as technically feasible, and such combinations are also encompassed within the scope of the invention as long as they fall within the spirit of the invention.

The information recording and reproducing device described above as the embodiment of the invention can be suitably modified and practiced by those skilled in the art, and such modifications are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An information recording and reproducing device comprising:
   a recording layer including a first layer containing a first compound including:
      a first positive ion element made of a transition metal element and serving as a first positive ion having a d orbital incompletely filled with electrons; and
      a second positive ion element serving as a second positive ion with a lower valence than a valence of the first positive ion; and
   a driving unit configured to generate a phase change in the recording layer and to record information by at least one of application of a voltage to the recording layer and application of a current to the recording layer,
   a coordination number of the first positive ion element at a position of a second coordination of the second positive ion element being 80% or more and less than 100% of the coordination number when the first compound being assumed to be a perfect crystal.

2. The device according to claim 1, wherein
the first positive ion element is at least one selected from the group consisting of Ti, V, Cr, Mn, Fe and Co.

3. The device according to claim 1, wherein
the second positive ion element is made of a representative element.

4. The device according to claim 1, wherein
the second positive ion element is at least one selected from the group consisting of Mg, Ca and Zn.

5. The device according to claim 1, wherein
the recording layer further includes a second layer provided to contact with the first layer and having a vacant site containable the first positive ion.

6. The device according to claim 1, further comprising:
a word line and a bit line provided so as to sandwich the recording layer,
the driving unit performing at least one of the application of the voltage to the recording layer and the application of the current to the recording layer via the word line and the bit line.

7. The device according to claim 1, further comprising:
a probe provided with the recording layer,
the driving unit performing at least one of the application of the voltage to the recording layer and the application of the current to a recording unit of the recording layer via the probe.

8. The device according to claim 1, further comprising:
an MIS transistor including a gate electrode and a gate insulation layer sandwiching the recording layer,
the driving unit performing at least one of the application of the voltage to the recording layer and the application of the current to the recording layer via the gate electrode.

9. The device according to claim 1, further comprising:
two second conductivity-type diffusion layers provided in a first conductivity-type semiconductor substrate;
a first conductivity-type semiconductor layer on the first conductivity-type semiconductor substrate between the two second conductivity-type diffusion layers; and
a gate electrode configured to control conduction/non-conduction between the two second conductivity-type diffusion layers,
the recording layer being disposed between the gate electrode and the first conductivity-type semiconductor layer, and
the driving unit performing at least one of the application of the voltage to the recording layer and the application of the current to the recording layer via the gate electrode.

10. An information recording and reproducing device comprising:
   a recording layer made of a first layer containing a second compound including an oxide including a first positive ion element made of a transition metal element and serving as a first positive ion having a d orbital incompletely filled with electrons; and
   a driving unit configured to generate a phase change in the recording layer and to record information by one of application of a voltage to the recording layer and application of a current to the recording layer,
   a coordination number of another of the first positive ion element at a position of a second coordination of the first positive ion element being 80% or more and less than 100% of the coordination number when the second compound being assumed to be a perfect crystal.

11. The device according to claim 10, wherein
the first positive ion element is at least one selected from the group consisting of Ti, V, Cr, Ni and Cu.

12. The device according to claim 10, wherein
the first positive ion element is at least one selected from the group consisting of Hf and W.

13. The device according to claim 10, wherein
the recording layer further includes a second layer provided to contact with the first layer and having a vacant site containable the ion of the first positive ion.

14. The device according to claim 10, further comprising:
a word line and a bit line provided so as to sandwich the recording layer,
the driving unit performing at least one of the application of the voltage to the recording layer and the application of the current to the recording layer via the word line and the bit line.

15. The device according to claim 10, further comprising:
a probe provided with the recording layer,
the driving unit performing at least one of the application of the voltage to the recording layer and the application of the current to a recording unit of the recording layer via the probe.

16. The device according to claim 10, further comprising:
an MIS transistor including a gate electrode and a gate insulation layer sandwiching the recording layer,
the driving unit performing at least one of the application of the voltage to the recording layer and the application of the current to the recording layer via the gate electrode.

17. The device according to claim 10, further comprising:
two second conductivity-type diffusion layers provided in a first conductivity-type semiconductor substrate;
a first conductivity-type semiconductor layer on the first conductivity-type semiconductor substrate between the two second conductivity-type diffusion layers; and
a gate electrode configured to control conduction/non-conduction between the two second conductivity-type diffusion layers,
the recording layer being arranged between the gate electrode and the first conductivity-type semiconductor layer, and the driving unit performing at least one of the application of the voltage to the recording layer and the application of the current to the recording layer via the gate electrode.

18. An information recording and reproducing device comprising:
a recording layer including a first layer containing a third compound including:
a third positive ion made of a transition metal element, having a d orbital incompletely filled with electrons and having a first valence; and
a fourth positive ion made of an element being same type as the third positive ion and having a second valence different from the first valence; and
a driving unit configured to generate a phase change in the recording layer and to record information by one of application of a voltage to the recording layer and application of a current to the recording layer,
a coordination number of the third positive ion at a position of a second coordination of the fourth positive ion being 80% or more and less than 100% of the coordination number when the third compound being assumed to be a perfect crystal.

19. The device according to claim 18, wherein an element serving as the third positive ion is at least one selected from the group consisting of Mn, Co, and Fe.

20. The device according to claim 18, wherein the first and second valences include divalent and trivalent.

21. The device according to claim 18, wherein the fourth positive ion is divalent.

22. The device according to claim 18, wherein the recording layer further includes a second layer provided to contact with the first layer and having a vacant site containable the fourth positive ion.

23. The device according to claim 18, further comprising:
a word line and a bit line provided so as to sandwich the recording layer,
the driving unit performing at least one of the application of the voltage to the recording layer and the application of the current to the recording layer via the word line and the bit line.

24. The device according to claim 18, further comprising:
a probe provided with the recording layer,
the driving unit performing at least one of the application of the voltage to the recording layer and the application of the current to a recording unit of the recording layer via the probe.

25. The device according to claim 18, further comprising:
an MIS transistor including a gate electrode and a gate insulation layer sandwiching the recording layer,
the driving unit performing at least one of the application of the voltage to the recording layer and the application of the current to the recording layer via the gate electrode.

26. The device according to claim 18, further comprising:
two second conductivity-type diffusion layers provided in a first conductivity-type semiconductor substrate;
a first conductivity-type semiconductor layer on the first conductivity-type semiconductor substrate between the two second conductivity-type diffusion layers; and
a gate electrode configured to control conduction/non-conduction between the two second conductivity-type diffusion layers,
the recording layer being arranged between the gate electrode and the first conductivity-type semiconductor layer, and
the driving unit performing at least one of the application of the voltage to the recording layer and the application of the current to the recording layer via the gate electrode.

* * * * *